US012744178B2

(12) United States Patent
Zhang et al.

(10) Patent No.: US 12,744,178 B2
(45) Date of Patent: Sep. 22, 2026

(54) SYSTEM AND METHOD FOR INSPECTION BY DEFLECTOR CONTROL IN A CHARGED PARTICLE SYSTEM

(71) Applicant: ASML Netherlands B.V., Veldhoven (NL)

(72) Inventors: Datong Zhang, Milpitas, CA (US); Chih-hung Wang, San Jose, CA (US); Oliver Desmond Patterson, San Jose, CA (US); Xiaohu Tang, Pleasanton, CA (US)

(73) Assignee: ASML Netherlands B.V., Veldhoven (NL)

(*) Notice: Subject to any disclaimer, the term of this patent is extended or adjusted under 35 U.S.C. 154(b) by 447 days.

(21) Appl. No.: 18/281,272

(22) PCT Filed: Feb. 9, 2022

(86) PCT No.: PCT/EP2022/053092
§ 371 (c)(1),
(2) Date: Sep. 8, 2023

(87) PCT Pub. No.: WO2022/189085
PCT Pub. Date: Sep. 15, 2022

(65) Prior Publication Data

US 2024/0153732 A1 May 9, 2024

Related U.S. Application Data

(60) Provisional application No. 63/158,320, filed on Mar. 8, 2021.

(51) Int. Cl.
*H01J 37/147* (2006.01)
*H01J 37/26* (2006.01)

(52) U.S. Cl.
CPC ........ *H01J 37/1474* (2013.01); *H01J 37/263* (2013.01); *H01J 37/265* (2013.01);
(Continued)

(58) Field of Classification Search
CPC ............ H01J 37/00; H01J 37/02; H01J 37/26; H01J 37/1474; H01J 37/263; H01J 37/265;
(Continued)

(56) References Cited

U.S. PATENT DOCUMENTS 5,602,489 A 2/1997 El-Kareh et al.
2003/0127593 A1* 7/2003 Shinada .................. H01J 37/29 250/310

(Continued)

FOREIGN PATENT DOCUMENTS

TW 202024769 A 7/2020
TW 202029262 A 8/2020
TW 202044312 A 12/2020

OTHER PUBLICATIONS

Patterson, O. D., Lee, V., Zhao, F.Y., "Enhancement of Voltage Contrast Inspection Signal Using Scan Direction," ISSM 2007, Oct. 2007.

Office Action issued by the Taiwanese Patent Office in related Foreign Application No. TW 111107457, issued Apr. 11, 2023.

(Continued)

*Primary Examiner* — Jason L McCormack
(74) *Attorney, Agent, or Firm* — FINNEGAN, HENDERSON, FARABOW, GARRETT & DUNNER, LLP

(57) ABSTRACT

Apparatuses, systems, and methods for providing beams for using deflector control to control charging on a sample surface of charged particle beam systems. In some embodiments, a controller including circuitry configured to scan a plurality of nodes of the sample to charge the plurality of
(Continued)

nodes; adjust a scan rate of a beam such that a quantity of charge deposited on each node of the plurality of nodes varies with respect to at least one other node; generate a plurality of images; and compare the plurality of images to enable detection of a defect associated with any of the plurality of nodes of the sample.

20 Claims, 9 Drawing Sheets

(52) U.S. Cl.
CPC .................. *H01J 2237/0048* (2013.01); *H01J 2237/24592* (2013.01)

(58) Field of Classification Search
CPC ............... H01J 37/28; H01J 2237/0048; H01J 2237/24592; G01R 31/2653
USPC ................................ 250/306, 307, 310, 311
See application file for complete search history.

(56) References Cited

U.S. PATENT DOCUMENTS

2004/0227077 A1* 11/2004 Takagi ............... G01N 23/2251 250/310
2013/0105690 A1* 5/2013 Katou ................. G01N 23/225 250/306
2015/0371819 A1* 12/2015 Li .......................... H01J 37/28 250/310
2016/0148781 A1 5/2016 Tsuno et al.
2019/0024783 A1 1/2019 Baumann
2019/0244783 A1 8/2019 Ohashi et al.
2020/0124546 A1 4/2020 Hu et al.

OTHER PUBLICATIONS

International Search Report issued in related Foreign Application No. PCT/EP2022/053092; mailed Jun. 17, 2022 (2 pgs.).

* cited by examiner

SYSTEM AND METHOD FOR INSPECTION BY DEFLECTOR CONTROL IN A CHARGED PARTICLE SYSTEM

CROSS-REFERENCE TO RELATED APPLICATIONS

This application claims priority to International Application No. PCT/EP2022/053092, filed Feb. 9, 2022, and published as WO 2022/189085 A1, which claims priority of U.S. application 63/158,320 which was filed on Mar. 8, 2021. The contents of these applications are incorporated herein by reference in their entireties.

FIELD

The description herein relates to the field of charged particle beam systems, and more particularly to systems for using deflector control to control charging on a sample surface of charged particle beam system inspection systems.

BACKGROUND

In manufacturing processes of integrated circuits (ICs), unfinished or finished circuit components are inspected to ensure that they are manufactured according to design and are free of defects. An inspection system utilizing an optical microscope typically has resolution down to a few hundred nanometers; and the resolution is limited by the wavelength of light. As the physical sizes of IC components continue to reduce down to sub-100 or even sub-10 nanometers, inspection systems capable of higher resolution than those utilizing optical microscopes are needed.

A charged particle (e.g., electron) beam microscope, such as a scanning electron microscope (SEM) or a transmission electron microscope (TEM), capable of resolution down to less than a nanometer, serves as a practicable tool for inspecting IC components having a feature size that is sub-100 nanometers. With a SEM, electrons of a single primary electron beam, or electrons of a plurality of primary electron beams, can be focused at locations of interest of a wafer under inspection. The primary electrons interact with the wafer and may be backscattered or may cause the wafer to emit secondary electrons. The intensity of the electron beams comprising the backscattered electrons and the secondary electrons may vary based on the properties of the internal and external structures of the wafer, and thereby may indicate whether the wafer has defects.

SUMMARY

Embodiments of the present disclosure provide apparatuses, systems, and methods for using deflector control to control charging on a sample surface of charged particle beam systems. In some embodiments, a controller including circuitry configured to scan a plurality of nodes of the sample to charge the plurality of nodes; adjust a scan rate of a beam such that a quantity of charge deposited on each node of the plurality of nodes varies with respect to at least one other node; generate a plurality of images; and compare the plurality of images to enable detection of a defect associated with any of the plurality of nodes of the sample.

In some embodiments, a method for inspection may include scanning a plurality of nodes of the sample to charge the plurality of nodes; adjusting a scan rate of a beam such that a quantity of charge deposited on each node of the plurality of nodes varies with respect to at least one other node; generating a plurality of images; and comparing the plurality of pixels to enable detection of a defect associated with any of the plurality of nodes of the sample.

In some embodiments, a non-transitory computer readable medium may store a set of instructions that is executable by at least one processor of a computing device to cause the computing device to perform a method for inspection. The method may include scanning a plurality of nodes of the sample to charge the plurality of nodes; adjusting a scan rate of a beam such that a quantity of charge deposited on each node of the plurality of nodes varies with respect to at least one other node; generating a plurality of images; and comparing the plurality of pixels to enable detection of a defect associated with any of the plurality of nodes of the sample.

DETAILED DESCRIPTION

Figure 1:
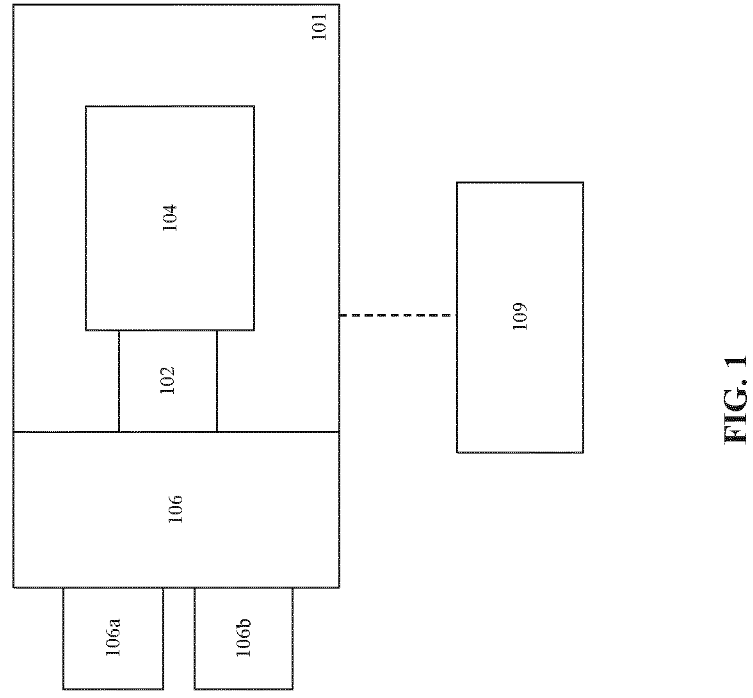
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the subject matter recited in the appended claims. For example, although some embodiments are described in the context of utilizing electron beams, the disclosure is not so limited. Other types of charged particle beams may be similarly applied. Furthermore, other imaging systems may be used, such as optical imaging, photodetection, x-ray detection, extreme ultraviolet inspection, deep ultraviolet inspection, or the like.

Electronic devices are constructed of circuits formed on a piece of silicon called a substrate. Many circuits may be formed together on the same piece of silicon and are called integrated circuits or ICs. The size of these circuits has decreased dramatically so that many more of them can fit on the substrate. For example, an IC chip in a smart phone can be as small as a thumbnail and yet may include over 2 billion transistors, the size of each transistor being less than 1/1000th the size of a human hair.

Making these extremely small ICs is a complex, time-consuming, and expensive process, often involving hundreds of individual steps. Errors in even one step have the potential to result in defects in the finished IC rendering it useless. Thus, one goal of the manufacturing process is to avoid such defects to maximize the number of functional ICs made in the process, that is, to improve the overall yield of the process.

One component of improving yield is monitoring the chip making process to ensure that it is producing a sufficient number of functional integrated circuits. One way to monitor the process is to inspect the chip circuit structures at various stages of their formation. Inspection may be carried out using a scanning electron microscope (SEM). A SEM can be used to image these extremely small structures, in effect, taking a "picture" of the structures of the wafer. The image can be used to determine if the structure was formed properly and also if it was formed at the proper location. If the structure is defective, then the process can be adjusted so the defect is less likely to recur. Defects may be generated during various stages of semiconductor processing. For the reason stated above, it is important to find defects accurately and efficiently as early as possible.

The working principle of a SEM is similar to a camera. A camera takes a picture by receiving and recording brightness and colors of light reflected or emitted from people or objects. A SEM takes a "picture" by receiving and recording energies or quantities of electrons reflected or emitted from the structures. Before taking such a "picture," an electron beam may be provided onto the structures, and when the electrons are reflected or emitted ("exiting") from the structures, a detector of the SEM may receive and record the energies or quantities of those electrons to generate an image. To take such a "picture," some SEMs use a single electron beam (referred to as a "single-beam SEM"), while some SEMs use multiple electron beams (referred to as a "multi-beam SEM") to take multiple "pictures" of the wafer. By using multiple electron beams, the SEM may provide more electron beams onto the structures for obtaining these multiple "pictures," resulting in more electrons exiting from the structures. Accordingly, the detector may receive more exiting electrons simultaneously, and generate images of the structures of the wafer with a higher efficiency and a faster speed.

When electrons from an electron beam are deposited on a node (e.g., a contact, a metal line, a gate, etc.) on a wafer, the voltage contrast responses of the node to the illumination of the electron beams may be measured, such as by taking an image of the node before the electrons are deposited on the node and after the electrons are deposited on the node and comparing the grey scale values of a point on the images that correspond to the node. Because voltage contrast responses may vary among nodes due to varying voltages on the nodes, the voltage contrast responses may be used to detect defects in the nodes.

An electrical short circuit is one type of defect where current may flow along an unintended path due to a resistive path being mistakenly formed between two nodes that were intended to be isolated. When an electrical short circuit exists between nodes, current will often flow between the nodes such that, given sufficient time, the two nodes have substantially the same voltage.

When infused with a constant amount of charge, two nodes of similar capacitance will change in voltage at a similar rate. When an electrical short exists between the two nodes, the electrical short circuit will not be detectable by voltage contrast imaging, because the two nodes will vary in voltage at this similar rate and will be at substantially the same voltage, regardless as to whether or not they are shorted together.

However, when infused with different amounts of charge, two nodes of similar capacitance will change in voltage at different rates. As a result, the voltage contrast response of nodes of similar capacitance may be different due to this difference in the rate of change of voltage. This characteristic can be used to detect shorts between nodes. When an electrical short circuit exists between the two nodes of similar capacitance, the electrical short circuit may be detected when each node is infused with different amounts of charge because, rather than the voltage contrast responses between the two nodes being different, which would be the case if they were not shorted due to the two nodes being at different voltages, the voltage contrast response may be substantially the same, due to charge flowing between the two nodes due to the short and causing the voltages of the two nodes to be substantially the same.

Some of the disclosed embodiments provide systems and methods that address some or all of these disadvantages by applying a non-uniform charge to a sample during inspection. The disclosed embodiments may scan a sample by adjusting a scan rate of a beam, thereby non-uniformly charging a plurality of nodes on the sample and allowing detection of defects using voltage contrast.

Relative dimensions of components in drawings may be exaggerated for clarity. Within the following description of drawings, the same or like reference numbers refer to the same or like components or entities, and only the differences with respect to the individual embodiments are described.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

FIG. 1 illustrates an exemplary electron beam inspection (EBI) system 100 consistent with embodiments of the present disclosure. EBI system 100 may be used for imaging. As shown in FIG. 1, EBI system 100 includes a main chamber 101, a load/lock chamber 102, an electron beam tool 104, and an equipment front end module (EFEM) 106. Electron beam tool 104 is located within main chamber 101. EFEM 106 includes a first loading port 106*a* and a second loading port 106*b*. EFEM 106 may include additional loading port(s). First loading port 106*a* and second loading port 106*b* receive wafer front opening unified pods (FOUPs) that contain wafers (e.g., semiconductor wafers or wafers made of other material(s)) or samples to be inspected (wafers and samples may be used interchangeably). A "lot" is a plurality of wafers that may be loaded for processing as a batch.

One or more robotic arms (not shown) in EFEM 106 may transport the wafers to load/lock chamber 102. Load/lock chamber 102 is connected to a load/lock vacuum pump system (not shown) which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown) which removes gas molecules in main chamber 101 to reach a second pressure below the first pressure. After reaching the second pressure, the wafer is subject to inspection by electron beam tool 104. Electron beam tool 104 may be a single-beam system or a multi-beam system.

A controller 109 is electronically connected to electron beam tool 104. Controller 109 may be a computer configured to execute various controls of EBI system 100. While controller 109 is shown in FIG. 1 as being outside of the structure that includes main chamber 101, load/lock chamber 102, and EFEM 106, it is appreciated that controller 109 may be a part of the structure.

In some embodiments, controller 109 may include one or more processors (not shown). A processor may be a generic or specific electronic device capable of manipulating or processing information. For example, the processor may include any combination of any number of a central processing unit (or "CPU"), a graphics processing unit (or "GPU"), an optical processor, a programmable logic controllers, a microcontroller, a microprocessor, a digital signal processor, an intellectual property (IP) core, a Programmable Logic Array (PLA), a Programmable Array Logic (PAL), a Generic Array Logic (GAL), a Complex Programmable Logic Device (CPLD), a Field-Programmable Gate Array (FPGA), a System On Chip (SoC), an Application-Specific Integrated Circuit (ASIC), and any type circuit capable of data processing. The processor may also be a virtual processor that includes one or more processors distributed across multiple machines or devices coupled via a network.

In some embodiments, controller 109 may further include one or more memories (not shown). A memory may be a generic or specific electronic device capable of storing codes and data accessible by the processor (e.g., via a bus). For example, the memory may include any combination of any number of a random-access memory (RAM), a read-only memory (ROM), an optical disc, a magnetic disk, a hard drive, a solid-state drive, a flash drive, a security digital (SD) card, a memory stick, a compact flash (CF) card, or any type of storage device. The codes may include an operating system (OS) and one or more application programs (or "apps") for specific tasks. The memory may also be a virtual memory that includes one or more memories distributed across multiple machines or devices coupled via a network.

Figure 2:
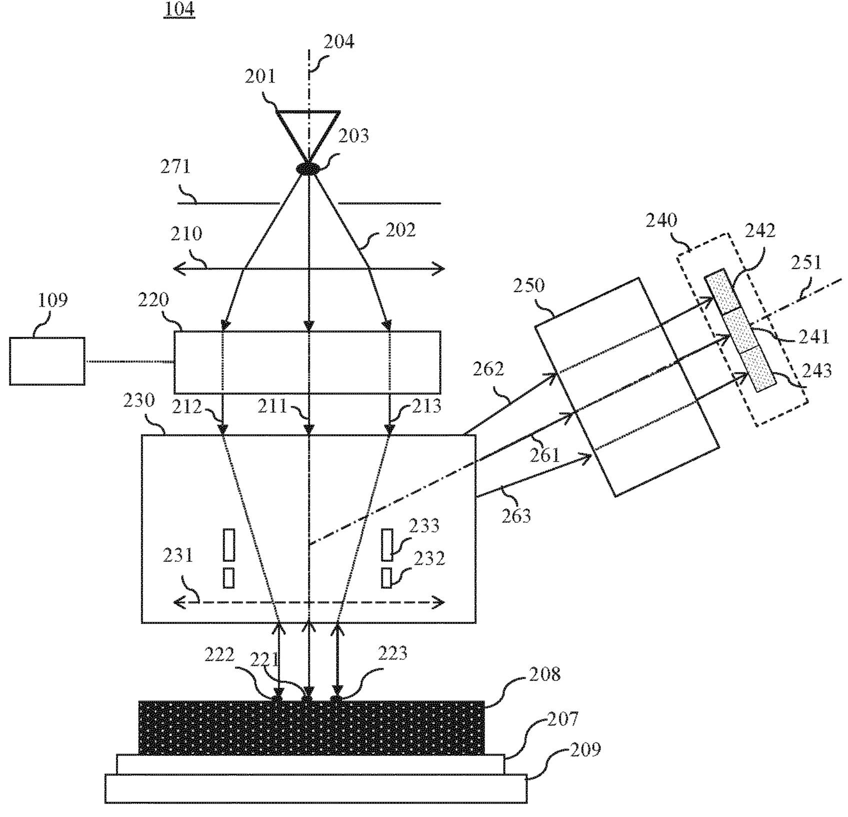
FIG. 2 is a schematic diagram illustrating an exemplary multi-beam system that is part of the exemplary charged particle beam inspection system of FIG. 1, consistent with embodiments of the present disclosure.

Reference is now made to FIG. 2, which is a schematic diagram illustrating an exemplary electron beam tool 104 including a multi-beam inspection tool that is part of the EBI system 100 of FIG. 1, consistent with embodiments of the present disclosure. In some embodiments, electron beam tool 104 may be operated as a single-beam inspection tool that is part of EBI system 100 of FIG. 1. Multi-beam electron beam tool 104 (also referred to herein as apparatus 104) comprises an electron source 201, a Coulomb aperture plate (or "gun aperture plate") 271, a condenser lens 210, a source conversion unit 220, a primary projection system 230, a motorized stage 209, and a sample holder 207 supported by motorized stage 209 to hold a sample 208 (e.g., a wafer or a photomask) to be inspected. Multi-beam electron beam tool 104 may further comprise a secondary projection system 250 and an electron detection device 240. Primary projection system 230 may comprise an objective lens 231. Electron detection device 240 may comprise a plurality of detection elements 241, 242, and 243. A beam separator 233 and a deflection scanning unit 232 may be positioned inside primary projection system 230.

Electron source 201, Coulomb aperture plate 271, condenser lens 210, source conversion unit 220, beam separator 233, deflection scanning unit 232, and primary projection system 230 may be aligned with a primary optical axis 204 of apparatus 104. Secondary projection system 250 and electron detection device 240 may be aligned with a secondary optical axis 251 of apparatus 104.

Electron source 201 may comprise a cathode (not shown) and an extractor or anode (not shown), in which, during operation, electron source 201 is configured to emit primary electrons from the cathode and the primary electrons are extracted or accelerated by the extractor and/or the anode to form a primary electron beam 202 that form a primary beam crossover (virtual or real) 203. Primary electron beam 202 may be visualized as being emitted from primary beam crossover 203.

Source conversion unit 220 may comprise an image-forming element array (not shown), an aberration compensator array (not shown), a beam-limit aperture array (not shown), and a pre-bending micro-deflector array (not shown). In some embodiments, the pre-bending micro-deflector array deflects a plurality of primary beamlets 211, 212, 213 of primary electron beam 202 to normally enter the beam-limit aperture array, the image-forming element array, and an aberration compensator array. In some embodiments, apparatus 104 may be operated as a single-beam system such that a single primary beamlet is generated. In some embodiments, condenser lens 210 is designed to focus primary electron beam 202 to become a parallel beam and be normally incident onto source conversion unit 220. The image-forming element array may comprise a plurality of micro-deflectors or micro-lenses to influence the plurality of primary beamlets 211, 212, 213 of primary electron beam 202 and to form a plurality of parallel images (virtual or real) of primary beam crossover 203, one for each of the primary beamlets 211, 212, and 213. In some embodiments, the aberration compensator array may comprise a field curvature compensator array (not shown) and an astigmatism compensator array (not shown). The field curvature compensator array may comprise a plurality of micro-lenses to compensate field curvature aberrations of the primary beamlets 211, 212, and 213. The astigmatism compensator array may comprise a plurality of micro-stigmators to compensate astigmatism aberrations of the primary beamlets 211, 212, and 213. The beam-limit aperture array may be configured to limit diameters of individual primary beamlets 211, 212, and 213. FIG. 2 shows three primary beamlets 211, 212, and 213 as an example, and it is appreciated that source conversion unit 220 may be configured to form any number of primary beamlets. Controller 109 may be connected to various parts of EBI system 100 of FIG. 1, such as source conversion unit 220, electron detection device 240, primary projection system 230, or motorized stage 209. In some embodiments, as explained in further details below, controller 109 may perform various image and signal processing functions. Controller 109 may also generate various control signals to govern operations of the charged particle beam inspection system.

Condenser lens 210 is configured to focus primary electron beam 202. Condenser lens 210 may further be configured to adjust electric currents of primary beamlets 211, 212, and 213 downstream of source conversion unit 220 by varying the focusing power of condenser lens 210. Alternatively, the electric currents may be changed by altering the radial sizes of beam-limit apertures within the beam-limit aperture array corresponding to the individual primary beamlets. The electric currents may be changed by both altering the radial sizes of beam-limit apertures and the focusing power of condenser lens 210. Condenser lens 210 may be an adjustable condenser lens that may be configured so that the position of its first principle plane is movable. The adjustable condenser lens may be configured to be magnetic, which may result in off-axis beamlets 212 and 213 illuminating source conversion unit 220 with rotation angles. The rotation angles change with the focusing power or the position of the first principal plane of the adjustable condenser lens. Condenser lens 210 may be an anti-rotation condenser lens that may be configured to keep the rotation angles unchanged while the focusing power of condenser lens 210 is changed. In some embodiments, condenser lens 210 may be an adjustable anti-rotation condenser lens, in which the rotation angles do not change when its focusing power and the position of its first principal plane are varied.

Objective lens 231 may be configured to focus beamlets 211, 212, and 213 onto a sample 208 for inspection and may form, in the current embodiments, three probe spots 221, 222, and 223 on the surface of sample 208. Coulomb aperture plate 271, in operation, is configured to block off peripheral electrons of primary electron beam 202 to reduce Coulomb effect. The Coulomb effect may enlarge the size of each of probe spots 221, 222, and 223 of primary beamlets 211, 212, 213, and therefore deteriorate inspection resolution.

Beam separator 233 may, for example, be a Wien filter comprising an electrostatic deflector generating an electrostatic dipole field and a magnetic dipole field (not shown in FIG. 2). In operation, beam separator 233 may be configured to exert an electrostatic force by electrostatic dipole field on individual electrons of primary beamlets 211, 212, and 213. The electrostatic force is equal in magnitude but opposite in direction to the magnetic force exerted by magnetic dipole field of beam separator 233 on the individual electrons. Primary beamlets 211, 212, and 213 may therefore pass at least substantially straight through beam separator 233 with at least substantially zero deflection angles.

Deflection scanning unit 232, in operation, is configured to deflect primary beamlets 211, 212, and 213 to scan probe spots 221, 222, and 223 across individual scanning areas in a section of the surface of sample 208. In response to incidence of primary beamlets 211, 212, and 213 or probe spots 221, 222, and 223 on sample 208, electrons emerge from sample 208 and generate three secondary electron beams 261, 262, and 263. Each of secondary electron beams 261, 262, and 263 typically comprise secondary electrons (having electron energy ≤50 eV) and backscattered electrons (having electron energy between 50 eV and the landing energy of primary beamlets 211, 212, and 213). Beam separator 233 is configured to deflect secondary electron beams 261, 262, and 263 towards secondary projection system 250. Secondary projection system 250 subsequently focuses secondary electron beams 261, 262, and 263 onto detection elements 241, 242, and 243 of electron detection device 240. Detection elements 241, 242, and 243 are arranged to detect corresponding secondary electron beams 261, 262, and 263 and generate corresponding signals which are sent to controller 109 or a signal processing system (not shown), e.g., to construct images of the corresponding scanned areas of sample 208.

In some embodiments, detection elements 241, 242, and 243 detect corresponding secondary electron beams 261, 262, and 263, respectively, and generate corresponding intensity signal outputs (not shown) to an image processing system (e.g., controller 109). In some embodiments, each detection element 241, 242, and 243 may comprise one or more pixels. The intensity signal output of a detection element may be a sum of signals generated by all the pixels within the detection element.

In some embodiments, controller 109 may comprise image processing system that includes an image acquirer (not shown), a storage (not shown). The image acquirer may comprise one or more processors. For example, the image acquirer may comprise a computer, server, mainframe host, terminals, personal computer, any kind of mobile computing devices, and the like, or a combination thereof. The image acquirer may be communicatively coupled to electron detection device 240 of apparatus 104 through a medium such as an electrical conductor, optical fiber cable, portable storage media, IR, Bluetooth, internet, wireless network, wireless radio, among others, or a combination thereof. In some embodiments, the image acquirer may receive a signal from electron detection device 240 and may construct an image. The image acquirer may thus acquire images of sample 208. The image acquirer may also perform various post-processing functions, such as generating contours, superimposing indicators on an acquired image, and the like. The image acquirer may be configured to perform adjustments of brightness and contrast, etc. of acquired images. In some embodiments, the storage may be a storage medium such as a hard disk, flash drive, cloud storage, random access memory (RAM), other types of computer readable memory, and the like. The storage may be coupled with the image acquirer and may be used for saving scanned raw image data as original images, and post-processed images.

In some embodiments, the image acquirer may acquire one or more images of a sample based on an imaging signal received from electron detection device 240. An imaging signal may correspond to a scanning operation for conducting charged particle imaging. An acquired image may be a single image comprising a plurality of imaging areas. The single image may be stored in the storage. The single image may be an original image that may be divided into a plurality of regions. Each of the regions may comprise one imaging area containing a feature of sample 208. The acquired images may comprise multiple images of a single imaging area of sample 208 sampled multiple times over a time sequence. The multiple images may be stored in the storage. In some embodiments, controller 109 may be configured to perform image processing steps with the multiple images of the same location of sample 208.

In some embodiments, controller 109 may include measurement circuitries (e.g., analog-to-digital converters) to obtain a distribution of the detected secondary electrons. The electron distribution data collected during a detection time window, in combination with corresponding scan path data of each of primary beamlets 211, 212, and 213 incident on the wafer surface, can be used to reconstruct images of the wafer structures under inspection. The reconstructed images can be used to reveal various features of the internal or external structures of sample 208, and thereby can be used to reveal any defects that may exist in the wafer.

In some embodiments, controller 109 may control motorized stage 209 to move sample 208 during inspection of sample 208. In some embodiments, controller 109 may enable motorized stage 209 to move sample 208 in a direction continuously at a constant speed. In other embodiments, controller 109 may enable motorized stage 209 to change the speed of the movement of sample 208 overtime depending on the steps of scanning process.

Although FIG. 2 shows that apparatus 104 uses three primary electron beams, it is appreciated that apparatus 104 may use two or more number of primary electron beams. The present disclosure does not limit the number of primary electron beams used in apparatus 104. In some embodiments, apparatus 104 may be a SEM used for lithography.

Compared with a single charged-particle beam imaging system ("single-beam system"), a multiple charged-particle beam imaging system ("multi-beam system") may be designed to optimize throughput for different scan modes. Embodiments of this disclosure provide a multi-beam system with the capability of optimizing throughput for different scan modes by using beam arrays with different geometries. adapting to different throughputs and resolution requirements.

A non-transitory computer readable medium may be provided that stores instructions for a processor (e.g., processor of controller 109 of FIGS. 1-2) to carry out image processing, data processing, beamlet scanning, database management, graphical display, operations of a charged particle beam apparatus, or another imaging device, or the like. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same.

Figure 3:
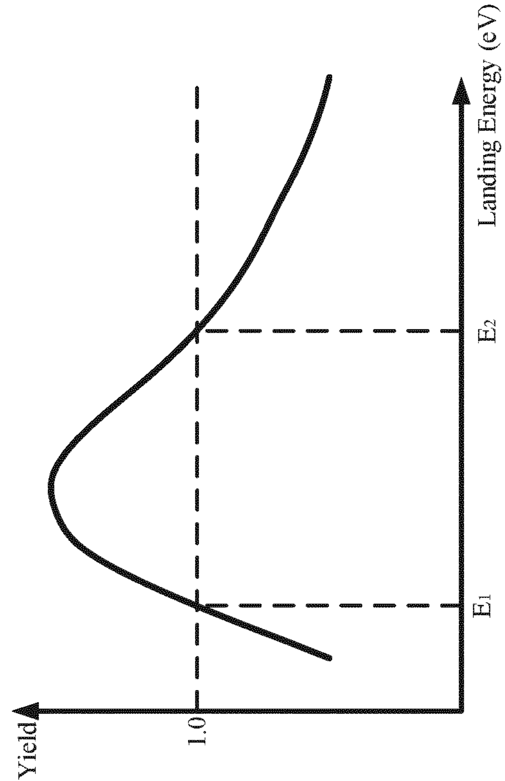
FIG. 3 is an exemplary graph showing a yield rate of secondary electrons relative to landing energy of primary electron beamlets, consistent with embodiments of the present disclosure.

FIG. 3 illustrates an exemplary graph showing a yield rate of secondary electrons relative to landing energy of primary electron beamlets, consistent with embodiments of the present disclosure. The graph illustrates the relationship of the landing energy of a plurality of beamlets of a primary electron beam (e.g., plurality of beamlets 211, 212, or 213 of primary electron beam 202 of FIG. 2) and the yield rate of secondary electron beams (e.g., secondary electron beams 261, 262, or 263 of FIG. 2). The yield rate indicates the number of secondary electrons that are produced in response to the impact of the primary electrons. For example, a yield rate greater than 1.0 indicates that more secondary electrons may be produced than the number of primary electrons that have landed on the wafer. Similarly, a yield rate of less than 1.0 indicates that less secondary electrons may be produced in response to the impact of the primary electrons.

As shown in the graph of FIG. 3, when the landing energy of the primary electrons is within a range from $E_1$ to $E_2$, more electrons may leave the surface of the wafer than land onto the surface of the wafer, which may result in a positive electrical potential at the surface of the wafer. In some embodiments, defect inspection may be performed in the foregoing range of landing energies, which is called "positive mode." An electron beam tool (e.g., electron beam tool 104 of FIG. 2) may generate a darker voltage contrast image of a device structure with a more positive surface potential since a detection device (e.g., detection device 240 of FIG. 2) may receive less secondary electrons (see FIG. 4).

When the landing energy is lower than $E_1$ or higher than $E_2$, less electrons may leave the surface of the wafer, thereby resulting in a negative electrical potential at the surface of the wafer. In some embodiments, defect inspection may be performed in this range of the landing energies, which is called "negative mode." An electron beam tool (e.g., electron beam tool 104 of FIG. 2) may generate a brighter voltage contrast image of a device structure with a more negative surface potential a detection device (e.g., detection device 240 of FIG. 2) may receive more secondary electrons (see FIG. 4).

In some embodiments, the landing energy of the primary electron beams may be controlled by the total bias between the electron source and the wafer.

Figure 4:
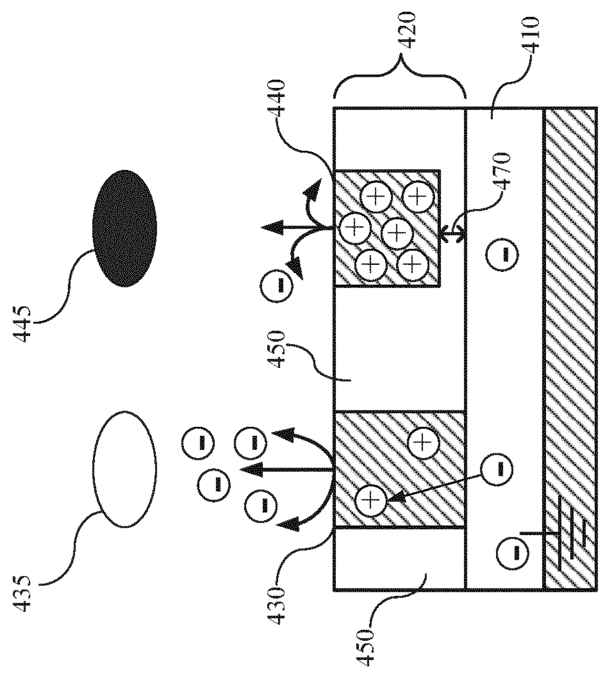
FIG. 4 is a schematic diagram illustrating an exemplary a voltage contrast response of a wafer, consistent with embodiments of the present disclosure.

FIG. 4 illustrates a schematic diagram of a voltage contrast response of a wafer, consistent with embodiments of the present disclosure. In some embodiments, physical and electrical defects in a wafer (e.g., resistive shorts and opens, defects in deep trench capacitors, back end of line (BEOL) defects, etc.) can be detected using a voltage contrast method of a charged particle inspection system. Defect detection using voltage contrast images may use a pre-scanning process (i.e., a charging, flooding, neutralization, or prepping process), where charged particles are applied to an area of the wafer (e.g., sample 208 of FIG. 2) to be inspected before conducting the inspection.

In some embodiments, an electron beam tool (e.g., electron beam tool 104 of FIG. 2) may be used to detect defects in internal or external structures of a wafer by illuminating the wafer with a plurality of beamlets of a primary electron beam (e.g., plurality of beamlets 211, 212, or 213 of primary electron beam 202 of FIG. 2) and measuring a voltage contrast response of the wafer to the illumination. In some embodiments, the wafer may comprise a test device region 420 that is developed on a substrate 410. In some embodiments, test device region 420 may include multiple device structures 430 and 440 separated by insulating material 450. For example, device structure 430 is connected to substrate 410. In contrast, device structure 440 is separated from substrate 410 by insulating material 450 such that a thin insulator structure 470 (e.g., thin oxide) exists between device structure 440 and substrate 410.

The electron beam tool may generate secondary electrons (e.g., secondary electron beams 261, 262, or 263 of FIG. 2) from the surface of test device region 520 by scanning the surface of test device region 520 with a plurality of beamlets of a primary electron beam. As explained above, when the landing energy of the primary electrons is between $E_1$ and $E_2$ (i.e., the yield rate is greater than 1.0 in FIG. 3), more electrons may leave the surface of the wafer than land on the surface, thereby resulting in a positive electrical potential at the surface of the wafer.

As shown in FIG. 4, a positive electrical potential may build-up at the surface of a wafer. For example, after an electron beam tool scans test device region 420 (e.g., during a pre-scanning process), device structure 440 may retain more positive charges because device structure 440 is not connected to an electrical ground in substrate 410, thereby resulting in a positive electrical potential at the surface of device structure 440. In contrast, primary electrons with the same landing energy (i.e., the same yield rate) applied to device structure 430 may result in less positive charges retained in device structure 430 since positive charges may be neutralized by electrons supplied by the connection to substrate 410.

An image processing system (e.g., controller 109 of FIG. 2) of an electron beam tool may generate voltage contrast images 435 and 445 of corresponding device structures 430 and 440, respectively. For example, device structure 430 is shorted to the ground and may not retain built-up positive charges. Accordingly, when primary electron beamlets land on the surface of the wafer during inspection, device structure 430 may repel more secondary electrons thereby resulting in a brighter voltage contrast image. In contrast, because device structure 440 has no connection to substrate 410 or any other grounds, device structure 440 may retain a build-up of positive charges. This build-up of positive charges may cause device structure 440 to repel less secondary electrons during inspection, thereby resulting in a darker voltage contrast image.

An electron beam tool (e.g., multi-beam electron beam tool 104 of FIG. 2) may pre-scan the surface of a wafer by supplying electrons to build up the electrical potential on the surface of the wafer. After pre-scanning the wafer, the electron beam tool may obtain images of multiple dies within the wafer. In some embodiments, defects may be detected by comparing the differences in voltage contrast images from multiple dies. For example, if non-uniform charging is applied to the wafer and the voltage contrast level of one image associated with a first node is the same as the voltage contrast level of an image associated with a second node, the die corresponding to the two voltage contrast levels may have an electrical short circuit defect. Pre-scanning is applied to the wafer under the assumption that the electrical surface potential built-up on the surface of the wafer during pre-scanning will be retained during inspection and will remain above the detection threshold of the electron beam tool.

However, the built-up surface potential level may change during inspection due to the effects of electrical breakdown or tunneling, thereby resulting in failure to detect defects. For example, when a high voltage is applied to a high resistance thin device structure (e.g., thin oxide), such as an insulator structure 470, leakage current may flow through the high resistance structure, thereby preventing the structure from functioning as a perfect insulator. This may affect circuit functionality and result in a device defect. A similar effect of leakage current may also occur in a structure with improperly formed materials or a high resistance metal layer, for example a cobalt silicide (e.g., CoSi, $CoSi_2$, $Co_2Si$, $Co_3Si$, etc.) layer between a tungsten plug and a source or drain area of a field-effect transistor (FET).

A defective etching process may leave a thin oxide resulting in unwanted electrical blockage (e.g., open circuit) between two structures (e.g., device structure 440 and substrate 410) intended to be electrically connected. For example, device structures 430 and 440 may be designed to make contact with substrate 410 and function identically, but due to manufacturing errors, insulator structure 470 may exist in device structure 440. In this case, insulator structure 470 may represent a defect susceptible to a breakdown effect.

Figure 5:
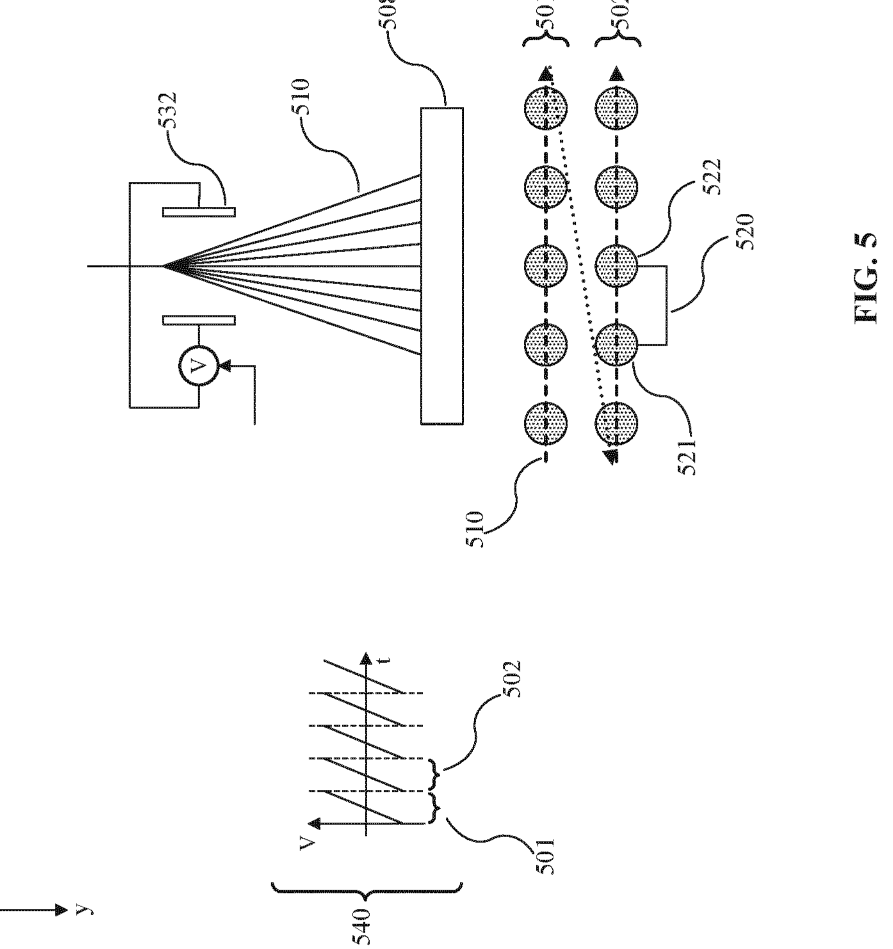
FIG. 5 is a schematic diagram illustrating an exemplary voltage applied to a deflector and voltage contrast response of a wafer, consistent with embodiments of the present disclosure.

FIG. 5 illustrates a schematic diagram illustrating an exemplary voltage applied to a deflector and voltage contrast response of a wafer consistent with embodiments of the present disclosure.

An image of a wafer 508 (e.g., wafer 208 of FIG. 2) may be formed by scanning a primary beam (e.g., primary beamlets 211, 212, or 213 of FIG. 2) of an electron tool (e.g., electron tool 104 of FIG. 2) over wafer 508 and collecting particles (e.g., secondary electrons) generated from wafer surface at a detector (detection device 240 of FIG. 2). The process of imaging may include focusing the primary beam to a point, and deflecting (e.g., bending) the beam so that it passes over regions of the wafer in a line-by-line pattern (e.g., a raster scan). At a given time, the beam may be focused to a particular position on wafer 508, and output of the detector at this time may be correlated to that particular position on wafer 508. An image may be reconstructed based on detector output at each time along the beam scan path.

Scanning may be performed by electrostatic deflectors (e.g., deflection scanning unit 232 of FIG. 2). In some embodiments, a deflector 532 may include two metallic plates with a voltage applied between the plates to create an electric field deflecting the electrons in the direction perpendicular to the primary optical axis (e.g., primary optical axis 204 of FIG. 2). Multiple pairs of metallic plates may be provided. In some embodiments, beam blankers may be used to control deflection of a beam.

In the scanning operation mode of a multi-beam system, deflector 532 constantly moves the array of primary beamlets across the inspected area of wafer 508. For example, deflector 532 may deflect beamlets so that beam spots (e.g., probe spots 221, 222, or 223 of FIG. 2) move from different positions on wafer 508 (e.g., across stripe 501 or stripe 502). Secondary electrons may be generated at each position that corresponding probe spots are formed at on the surface of wafer 508. The origin positions of the secondary electron beamlets during scanning may change constantly in operation, and the paths of the secondary electron beamlets through the electron-optical system may also change.

For example, an electron beam tool (e.g., electron beam tool 104 of FIG. 2) may generate images by continuous raster scanning electron beam 510 over wafer 508 including a plurality of nodes (e.g., contacts). The speed of a motorized stage (e.g., motorized stage 209 of FIG. 2) may be controlled so that the speed of the stage holding wafer 508 may vary during inspection and so that wafer 508 may be continuously scanned. FIG. 5 shows an exemplary sequence of continuous raster scanning to generate an image comprising a plurality of pixels.

As used herein, pixels may refer to pixels in an image or to pixels defined in the field of view of a wafer exposed to a beam.

In raster scanning, electron beam 510 moves horizontally at one or more rates from left to right to scan stripe (or line) 501 of pixels comprising a plurality of nodes across wafer 508. In some embodiments, electron beam 510 may have a size (e.g., diameter) that is large enough to scan an entire pixel. Once electron beam 510 reaches the last pixel of the stripe being scanned (e.g., stripe 501), the beam rapidly moves back to the first pixel of the next stripe 502, where scanning of the next row may start. These steps may be repeated for a plurality of pixels of a plurality of stripes on wafer 508. In back-and-forth scanning, rather than always scanning in one direction, some stripes may be scanned in one direction while other stripes may be scanned in a second opposite direction. For example, after scanning pixels of stripe 501, the electron beam can be adjusted vertically to align with stripe 502, and the beam may then scan stripe 502.

The electron beam may scan some stripes in a first direction (e.g., from left to right), and may scan other stripes in a second direction opposite of the first direction (e.g., from right to left). In some embodiments, electron beam 510 may be repositioned to a different location, where scanning of a different area of the wafer may begin. In some other embodiments, multiple beams may be used to scan the wafer using a multi-beam tool. The present disclosure does not limit the number of rows or pixels on a wafer. More information on continuous scanning using a multi-beam apparatus can be found in U.S. Patent Application No. 62/850,461, which is incorporated by reference in its entirety. In some embodiments, leap-and-scan mode may be used during inspection.

A deflector 532 (e.g., deflection scanning unit 232 of FIG. 2) that may be communicatively coupled to the controller (e.g., controller 109 of FIGS. 1-2) may be configured to deflect electron beam 510 during inspection such that a pattern of electron beam 510 interacting with deflector 532 and wafer 508 may be a raster pattern during inspection while the inspection speed varies. For example, deflector 532 may deflect electron beam 510 in a direction that is diagonal to the direction x, direction x being perpendicular to direction y and direction y being the direction in which the motorized stage moves during a continuous scan inspection. Inspection throughput may be increased by deflector 532 continuously deflecting electron beam 510 in a direction diagonal to the direction x in which a probe spot (e.g., probe spots 221, 222, or 223 of FIG. 2) of electron beam 510 moves along a stripe of wafer 508 while the speed of the motorized stage varies. In some embodiments, deflector 532 may swing to different positions to compensate the varying movement of the motorized stage so that the acquired images are not distorted. Although electron beam 510 is depicted as moving between stripes 501 and 502 of wafer 508 in the direction y, it is appreciated that the trajectory of the beam as it moves along each stripe may be slightly diagonal relative to a fixed position (e.g., earth) to account for the stage moving in the direction y.

In some embodiments, wafer 508 may include a plurality of nodes (e.g., nodes 521 or 522) that have substantially the same capacitance (e.g., have substantially the same size). As shown in graph 540, for each stripe (e.g., stripe 501 or 502) of wafer 508, the electron beam tool may apply a voltage between the plates of deflector 532 linearly with respect to time. For example, the electron beam tool may apply voltage to deflector 532 linearly with respect to time such that electrons are deflected to and beam spots move across stripe 501 of wafer at a constant rate (e.g., a constant scan rate, charge rate, etc.). In some embodiments, applying voltage to deflector 532 linearly with respect to time may result in each node of wafer 508 being charged in substantially equal quantities. In some embodiments, a constant scan rate may result in each pixel of a generated image being the same size. In some embodiments, charging of each node may be controlled by changing the number of scans on the wafer, changing the current of a beam that is directed to a node, etc. In some embodiments, one or more settings (e.g., number of scans on the wafer, current of a beam directed to a node, etc.) may be changed while other settings remain constant during scanning.

In some embodiments, an electrical short circuit 520 (e.g., resistive short) may exist between node 521 and node 522. Because node 521 and node 522 have substantially the same capacitance and charged equal amounts, current may flow between node 521 and node 522 such that node 521 and node 522 have the same voltage. Therefore, as shown in FIG. 5, the voltage contrast response of node 521 and may be the same as the voltage response of node 522 and the electrical short circuit may not be detectable during inspection.

The present disclosure does not limit the embodiments to those of FIG. 5. For example, the number of electron beams, stripes, nodes, and speed of the motorized stage are not limited. In some embodiments, the speed of the motorized stage may be controlled so that the speed of the probe spot may be adjusted for different regions of a sample. In some embodiments, a multi-beam system may be used for scanning.

Figure 6:
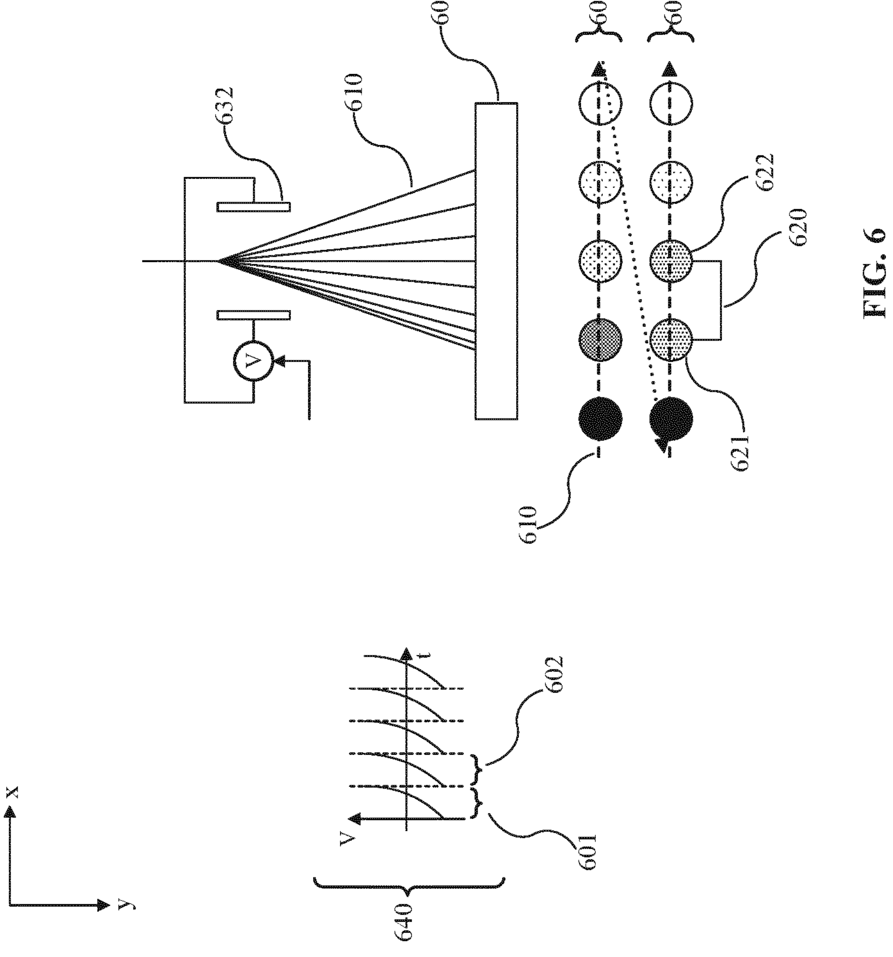
FIG. 6 is a schematic diagram illustrating an exemplary voltage applied to a deflector and voltage contrast response of a wafer, consistent with embodiments of the present disclosure.

FIG. 6 illustrates a schematic diagram illustrating an exemplary voltage applied to a deflector and voltage contrast response of a wafer consistent with embodiments of the present disclosure.

Similar to the system described above for FIG. 5, an image of a wafer 608 (e.g., wafer 208 of FIG. 2) may be formed by scanning a primary beam (e.g., primary beamlets 211, 212, or 213 of FIG. 2) of an electron tool (e.g., electron tool 104 of FIG. 2) over wafer 608 and collecting particles (e.g., secondary electron beams 261, 262, or 263 of FIG. 2) generated from wafer surface at a detector (e.g., detection device 240 of FIG. 2). The process of imaging may include focusing the primary beam to a point, and deflecting (e.g., bending) the beam so that it passes over regions of the wafer in a line-by-line pattern (e.g., a raster scan). At a given time, the beam may be focused to a particular position on wafer 608, and output of the detector at this time may be correlated to that particular position on wafer 608. An image may be reconstructed based on detector output at each time along the beam scan path.

Scanning may be performed by one or more electrostatic deflectors (e.g., deflection scanning unit 232 of FIG. 2). In some embodiments, a deflector 632 may include two metallic plates with a voltage applied between the plates to create an electric field deflecting the electrons in the direction perpendicular to the primary optical axis (e.g., primary optical axis 204 of FIG. 2). Multiple pairs of metallic plates may be provided. In some embodiments, beam blankers may be used to control deflection of a beam.

In the scanning operation mode of a multi-beam system, deflector 632 constantly moves the array of primary beamlets across the inspected area of wafer 608. For example, deflector 632 may deflect beamlets so that beam spots (e.g., probe spots 221, 222, or 223 of FIG. 2) move from different positions on wafer 608 (e.g., across stripe 601 or stripe 602). Secondary electrons may be generated at each position that corresponding probe spots are formed at on the surface of wafer 608. The origin positions of the secondary electron beamlets during scanning may change constantly in operation, and the paths of the secondary electron beamlets through the electron-optical system may also change.

For example, an electron beam tool (e.g., electron beam tool 104 of FIG. 2) may generate images by continuous raster scanning electron beam 610 over wafer 608 including a plurality of nodes (e.g., contacts). The speed of a motorized stage (e.g., motorized stage 209 of FIG. 2) may be controlled so that the speed of the stage holding wafer 608 may vary during inspection and so that wafer 608 may be continuously scanned. FIG. 6 shows an exemplary sequence of continuous raster scanning to generate an image comprising a plurality of pixels.

As used herein, pixels may refer to pixels in an image or to pixels defined in the field of view of a wafer exposed to a beam.

In raster scanning, electron beam 610 moves horizontally at one or more rates from left to right to scan stripe (or line) 601 of pixels comprising a plurality of nodes across wafer 608. In some embodiments, electron beam 610 may have a size (e.g., diameter) that is large enough to scan an entire pixel. Once electron beam 610 reaches the last pixel of the stripe being scanned (e.g., stripe 601), the beam rapidly moves back to the first pixel of the next stripe 602, where scanning of the next row may start. These steps may be repeated for a plurality of pixels of a plurality of stripes on wafer 568. In back-and-forth scanning, rather than always scanning in one direction, some stripes may be scanned in one direction while other stripes may be scanned in a second opposite direction. For example, after scanning pixels of stripe 601, the electron beam can be adjusted vertically to align with stripe 602, and the beam may then scan stripe 602.

The electron beam may scan some stripes in a first direction (e.g., from left to right), and may scan other stripes in a second direction opposite of the first direction (e.g., from right to left). In some embodiments, electron beam 610 may be repositioned to a different location, where scanning of a different area of the wafer may begin. In some other embodiments, multiple beams may be used to scan the wafer using a multi-beam tool. The present disclosure does not limit the number of rows or pixels on a wafer. More information on continuous scanning using a multi-beam apparatus can be found in U.S. Patent Application No. 62/850,461, which is incorporated by reference in its entirety. In some embodiments, leap-and-scan mode may be used during inspection.

Deflector 632 (e.g., deflection scanning unit 232 of FIG. 2) may be communicatively coupled to the controller (e.g., controller 109 of FIGS. 1-2) which may be configured to deflect electron beam 610 during inspection such that a pattern of electron beam 610 interacting with deflector 632 and wafer 608 may be a raster pattern during inspection while the inspection speed varies. For example, deflector 632 may deflect electron beam 610 in a direction that is diagonal to the direction x, direction x being perpendicular to direction y and direction y being the direction in which the motorized stage moves during a continuous scan inspection. Inspection throughput may be increased by deflector 632 continuously deflecting electron beam 610 in a direction diagonal to the direction x in which a probe spot (e.g., probe spots 221, 222, or 223 of FIG. 2) of electron beam 610 moves along a stripe of wafer 608 while the speed of the motorized stage varies. In some embodiments, deflector 632 may swing to different positions to compensate the varying movement of the motorized stage so that the acquired images are not distorted. Although electron beam 610 is depicted as moving between stripes 601 and 602 of wafer 608 in the direction y, it is appreciated that the trajectory of the beam as it moves along each stripe may be slightly diagonal relative to a fixed position (e.g., earth) to account for the stage moving in the direction y.

In some embodiments, wafer 608 may include a plurality of nodes (e.g., nodes 621 or 622) that have substantially the same capacitance. As shown in graph 640, for each stripe (e.g., stripe 601 or 602) of wafer 608, the electron beam tool may apply a voltage between the plates of deflector 632 non-linearly (e.g., parabolically) with respect to time. For example, the electron beam tool may apply voltage to deflector 632 non-linearly with respect to time such that electrons are deflected to and beam spots move across stripe 601 of wafer at varying rates (e.g., varying scan rates, varying scan accelerations, varying charge rates, varying charge accelerations, etc.). In some embodiments, varying scan rates may result in varying time intervals between the times at which any particular location on wafer 608 is successively scanned by each of multiple beams. In some embodiments, charging of each node may be controlled by changing the number of scans on the wafer, changing the current of a beam that is directed to a node, etc. In some embodiments, one or more settings (e.g., number of scans on the wafer, current of a beam directed to a node, etc.) may be changed while other settings remain constant during scanning.

In some embodiments, non-uniform charging of wafer 608 may be achieved by adjusting the speed of the motorized stage or the time intervals between the times at which any particular location on wafer 608 is successively scanned by each of multiple beams. A detector (e.g., detection device 240 of FIG. 2) may be configured to produce detection data based on a detection of a plurality of secondary charged particles (e.g., secondary electron beams 261, 262, or 263 of FIG. 2) associated with the plurality of beamlets of a primary electron beam impacting the first surface area.

In some embodiments, varying scan rates may result in each node of wafer 608 being charged in different quantities (e.g., non-uniform charging). In some embodiments, varying scan rates may result in each pixel of a generated image varying in size. In some embodiments, non-uniform charging of wafer 608 may be controlled by setting target pixel sizes (e.g., such that a beam contacts wafer 608 every "n" nm of wafer 608) and adjusting the voltage applied to deflector 632, adjusting the motorized stage speed, adjusting the scanning time intervals, etc. according to the target pixel sizes. In some embodiments, non-uniform charging of wafer 608 may be controlled by setting a target scan width of wafer 608. In some embodiments, one or more pixels of a wafer or pixels of an image may be associated with a node on wafer 608.

In some embodiments, each stripe (e.g., stripe 601 or stripe 602) of wafer 608 may be scanned such that the generated pixel size of an image increases as electron beam 610 is emitted along stripe 601 from left to right in the x-direction. In some embodiments, the increasing pixel size may be generated along a stripe by adjusting the scanning rate such that the velocity at which electron beam 610 traverses a surface of wafer 608 during a scan of the stripe decreases along the stripe. In some embodiments, the quantity of charge deposited on each node may decrease from left to right in the x-direction since electron beam 610 may contact each node in decreasing from left to right of the stripe.

As a result, the total count of primary electrons may decrease from left to right along the stripe such that on the left side of the stripe, more electrons may leave the surface of wafer 608 than land onto the surface of wafer 608, which may result in a positive electrical potential at the surface of wafer 608. Due to the decreasing quantity of charge deposited on each node and decreasing quantity of positive surface potential from left to right along the stripe, an electron beam tool may generate a voltage contrast image associated with each node that varies in gradient (e.g., varies increasingly or decreasingly along a direction). Since a detection device (e.g., detection device 240 of FIG. 2) may receive fewer secondary electrons when the electrical potential at the surface of wafer 608 is positive, the voltage contrast image associated with each node may vary in gradient such that the voltage contrast image becomes brighter from left to right along a stripe.

In some embodiments, the increase or decrease in scanning rates may change in equivalent increments along a stripe of wafer 608. For example, the pixel size of each pixel of a generated image along a stripe may be 5 nm, 10 nm, 15 nm, etc. In some embodiments, the increase or decrease in non-uniform charging may change in varying increments of scanning rates along a stripe of wafer 608. For example, the pixel size of each pixel of a generated image along a stripe may be 5 nm, 7 nm, 10 nm, 16 nm, etc.

In some embodiments, each stripe of wafer 608 may be scanned in the same non-uniform manner. For example, voltage contrast images generated for stripe 601 may vary in a gradient that is equivalent to voltage contrast images generated for stripe 602. In some embodiments, each stripe of wafer 608 may be scanned non-uniformly in varying pattern. For example, voltage contrast images generated for stripe 601 may vary in a gradient that is different from voltage contrast images generated for stripe 602.

In some embodiments, each node of wafer 608 may have substantially the same capacitance. In some embodiments, inspection of the nodes of wafer 608 may include comparing voltage contrast images along a stripe of wafer 608. For example, voltage contrast images of a stripe of nodes without any defects may show a gradient of voltage contrast levels such that each node of the stripe is a different voltage contrast level. In some embodiments, inspection of the nodes of wafer 608 may include comparing voltage contrast images along a column of nodes arranged in the y-direction. For example, voltage contrast images of a column of nodes arranged in the y-direction without any defects may show a gradient of voltage contrast levels such that each node of the column is a different voltage contrast level. In some embodiments, a voltage contrast level of a selected node may be indicated by a grey scale value of a point on an image (e.g., SEM image) that is associated with the selected node.

In some embodiments, an electrical short circuit 620 (e.g., resistive short) may exist between node 621 and node 622. Even though node 621 and node 622 are not charged equal amounts due to non-uniform charging, current may flow between node 621 and node 622 such that node 621 and node 622 have substantially the same voltage. Therefore, as shown in FIG. 6, the voltage contrast response of node 621 and may be substantially the same as the voltage response of node 622 and electrical short circuit 620 may advantageously be detectable during inspection since non-uniform charging of wafer 608 results in voltage contrast images that vary in gradient for each node along a row (e.g., stripe 601 or stripe 602) of wafer 608.

In some embodiments, voltage contrast images of wafer 608 may be compared to voltage contrast images of the same pattern on a neighboring die to detect defects. In some embodiments, voltage contrast images of wafer 608 may be compared to voltage contrast images of a "perfect" die (e.g., a die without defects) that was scanned at a different time to detect defects.

The present disclosure does not limit the embodiments to those of FIG. 6. For example, the number of electron beams, stripes, nodes, and speed of the motorized stage are not limited. In some embodiments, the speed of the motorized stage may be controlled so that the speed of the probe spot may be adjusted for different regions of a sample. In some embodiments, a multi-beam system may be used for scanning.

Figure 7:
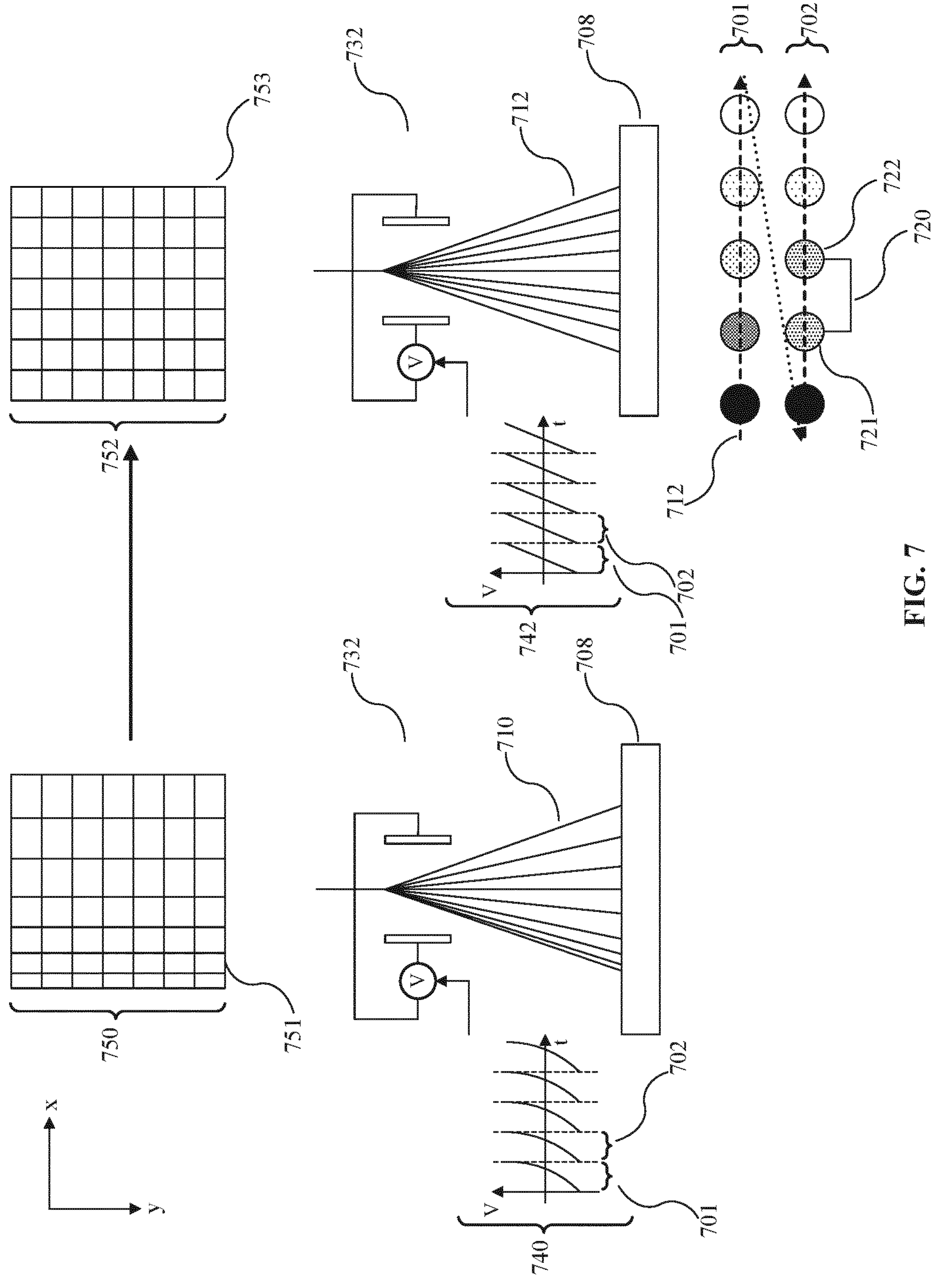
FIG. 7 is a schematic diagram illustrating exemplary image pixel layouts of a wafer during inspection, consistent with embodiments of the present disclosure.

FIG. 7 illustrates a schematic diagram illustrating exemplary image pixel layouts of a wafer during inspection consistent with embodiments of the present disclosure.

Similar to the system described above for FIG. 6, an image of a wafer 708 (e.g., wafer 208 of FIG. 2) may be formed by scanning a primary beam (e.g., primary beamlets 211, 212, or 213 of FIG. 2) of an electron tool (e.g., electron tool 104 of FIG. 2) over wafer 708 and collecting particles (e.g., secondary electron beams 261, 262, or 263 of FIG. 2) generated from wafer surface at a detector (e.g., detection device 240 of FIG. 2). The process of imaging may include focusing the primary beam to a point, and deflecting (e.g., bending) the beam so that it passes over regions of the wafer in a line-by-line pattern (e.g., a raster scan). At a given time, the beam may be focused to a particular position on wafer 708, and output of the detector at this time may be correlated to that particular position on wafer 708. An image may be reconstructed based on detector output at each time along the beam scan path.

Scanning may be performed by electrostatic deflectors (e.g., deflection scanning unit 232 of FIG. 2). In some embodiments, a deflector 732 may include two metallic plates with a voltage applied between the plates to create an electric field deflecting the electrons in the direction perpendicular to the primary optical axis (e.g., primary optical axis 204 of FIG. 2). Multiple pairs of metallic plates may be provided. In some embodiments, beam blankers may be used to control deflection of a beam.

In the scanning operation mode of a multi-beam system, deflector 732 constantly moves the array of primary beamlets across the inspected area of wafer 708. For example, deflector 732 may deflect beamlets so that beam spots (e.g., probe spots 221, 222, or 223 of FIG. 2) move from different positions on wafer 708 (e.g., across stripe 701 or stripe 702). Secondary electrons may be generated at each position that corresponding probe spots are formed at on the surface of wafer 708. The origin positions of the secondary electron beamlets during scanning may change constantly in operation, and the paths of the secondary electron beamlets through the electron-optical system may also change.

For example, an electron beam tool (e.g., electron beam tool 104 of FIG. 2) may generate images by continuous raster scanning of one or more electron beams over wafer 708 including a plurality of nodes (e.g., contacts). The speed of a motorized stage (e.g., motorized stage 209 of FIG. 2) may be controlled so that the speed of the stage holding wafer 708 may vary during inspection and so that wafer 708 may be continuously scanned. FIG. 7 shows an exemplary sequence of continuous raster scanning to generate an image comprising a plurality of pixels.

As used herein, pixels may refer to pixels in an image or to pixels defined in the field of view of a wafer exposed to a beam.

In some embodiments, wafer 708 may include a plurality of nodes (e.g., nodes 721 or 722) that have substantially the same capacitance. In some embodiments, as shown in graph 740, for each stripe (e.g., stripe 701 or 702) of wafer 708, the electron beam tool may apply a voltage between the plates of deflector 732 non-linearly (e.g., parabolically) with respect to time. For example, the electron beam tool may apply voltage to deflector 732 non-linearly with respect to time such that electrons are deflected to and beam spots move across stripe 701 of wafer 708 at varying rates (e.g., varying scan rates, varying scan accelerations, varying charge rates, varying charge accelerations, etc.). In some embodiments, varying scan rates may result in varying time intervals between the times at which any particular location on wafer 708 is successively scanned by each of multiple beams (e.g., electron beam 710). In some embodiments, charging of each node may be controlled by changing the number of scans on the wafer, changing the current of a beam that is directed to a node, etc. In some embodiments, one or more settings (e.g., number of scans on the wafer, current of a beam directed to a node, etc.) may be changed while other settings remain constant during scanning.

In some embodiments, non-uniform charging of wafer 708 may be achieved by adjusting the speed of the motorized stage or the time intervals between the times at which any particular location on wafer 708 is successively scanned by each of multiple beams. A detector (e.g., detection device 240 of FIG. 2) may be configured to produce detection data based on a detection of a plurality of secondary charged particles (e.g., secondary electron beams 261, 262, or 263 of FIG. 2) associated with the plurality of beamlets of a primary electron beam impacting the first surface area.

In some embodiments, varying scan rates may result in each node of wafer 708 being charged in different quantities (e.g., non-uniform charging). In some embodiments, as shown in pixel layout 750, varying scan rates may result in each pixel 751 of a generated image varying in size. In some embodiments, non-uniform charging may be a pre-scanning step where images are not generated during the pre-scanning step.

In some embodiments, non-uniform charging of wafer 708 may be controlled by setting target pixel sizes (e.g., such that a beam contacts wafer 708 every "n" nm of wafer 708) and adjusting the voltage applied to deflector 732, adjusting the motorized stage speed, adjusting the scanning time intervals, etc. according to the target pixel sizes. In some embodiments, non-uniform charging of wafer 708 may be controlled by setting a target scan width of wafer 708. In some embodiments, one or more pixels 751 of an image may be associated with a node on wafer 708.

In some embodiments, each stripe (e.g., stripe 701 or stripe 702) of wafer 708 may be scanned such that the generated pixel size increases as electron beam 710 is emitted along stripe 701 from left to right in the x-direction. In some embodiments, the increasing pixel size may be generated along a stripe by adjusting the scanning rate such that the velocity at which electron beam 710 traverses a surface of wafer 708 during a scan of the stripe decreases along the stripe. In some embodiments, the quantity of charge deposited on each node may decrease from left to right in the x-direction since electron beam 710 may contact each node in decreasing from left to right of the stripe.

As a result, the total count of primary electrons may decrease from left to right along the stripe such that on the left side of the stripe, more electrons may leave the surface of wafer 708 than land onto the surface of wafer 708, which may result in a positive electrical potential at the surface of wafer 708.

In some embodiments, a uniform low-current scanning step may follow the non-uniform charging step. For example, as shown in graph 742, for each stripe (e.g., stripe 701 or 702) of wafer 708, the electron beam tool may scan each stripe at a constant scan rate. For example, the electron beam tool may apply voltage to deflector 732 linearly with respect to time such that electrons (e.g., electron beam 712) are deflected to and beam spots move across each stripe of wafer 708 at a constant rate. In some embodiments, voltage may be applied to deflector 732 linearly with respect to time such that each node of wafer 708 is charged with equal quantities of charge (e.g., charged with low current) so that the effects of the non-uniform charging step remain in the nodes. As shown in pixel layout 752, in some embodiments, applying voltage to deflector 732 linearly with respect to time may result in each pixel 753 of a generated image being substantially the same size.

Due to the decreasing quantity of charge deposited on each node and decreasing quantity of positive surface potential from left to right along the stripe, an electron beam tool may generate a voltage contrast image associated with each node that varies in gradient. Since a detection device (e.g., detection device 240 of FIG. 2) may receive fewer secondary electrons when the electrical potential at the surface of wafer 708 is positive, the voltage contrast image associated with each node may vary in gradient such that the voltage contrast image becomes brighter from left to right along a stripe.

In some embodiments, each node of wafer 708 may have substantially the same capacitance. In some embodiments, inspection of the nodes of wafer 708 may include comparing voltage contrast images along a stripe of wafer 708. For example, voltage contrast images of a stripe of nodes without any defects may show a gradient of voltage contrast levels such that each node of the stripe is a different voltage contrast level. In some embodiments, inspection of the nodes of wafer 708 may include comparing voltage contrast images along a column of nodes arranged in the y-direction. For example, voltage contrast images of a column of nodes arranged in the y-direction without any defects may show a gradient of voltage contrast levels such that each node of the column is a different voltage contrast level. In some embodiments, a voltage contrast level of a selected node may be indicated by a grey scale value of a point on an image (e.g., SEM image) that is associated with the selected node.

In some embodiments, an electrical short circuit 720 (e.g., resistive short) may exist between node 721 and node 722. Even though node 721 and node 722 are not charged equal amounts due to non-uniform charging, current may flow between node 721 and node 722 such that node 721 and node 722 have substantially the same voltage. Therefore, as shown in FIG. 7, the voltage contrast response of node 721 may be substantially the same as the voltage response of node 722, and electrical short circuit 720 may advantageously be detectable during inspection since non-uniform charging of wafer 708 results in voltage contrast images that vary in gradient for each node along a row (e.g., stripe 701 or stripe 702) of wafer 708.

In some embodiments, voltage contrast images of wafer 708 may be compared to voltage contrast images of the same pattern on a neighboring die to detect defects. In some embodiments, voltage contrast images of wafer 708 may be compared to voltage contrast images of a "perfect" die (e.g., a die without defects) that was scanned at a different time to detect defects.

Figure 8:
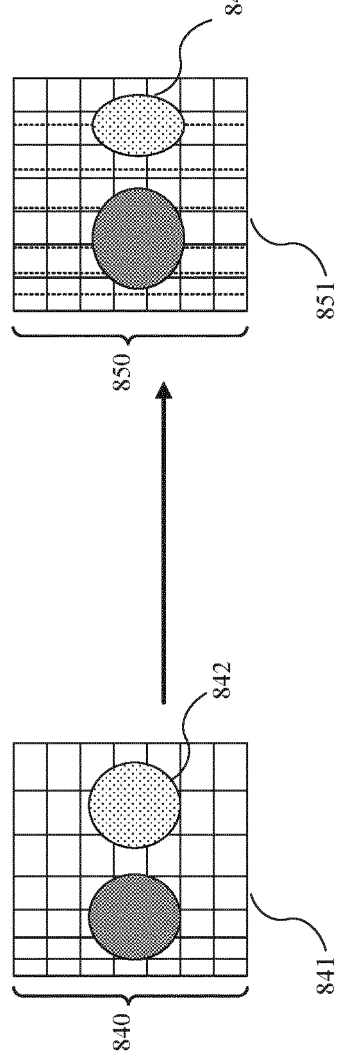
FIG. 8 is a schematic diagram illustrating exemplary image pixel layouts of a wafer during inspection, consistent with embodiments of the present disclosure.
Figure 8:
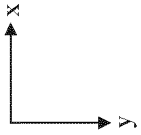

FIG. 8 illustrates a schematic diagram illustrating exemplary image pixel layouts of a wafer during inspection consistent with embodiments of the present disclosure.

In some embodiments, non-uniform charging may proceed during inspection as described above for FIGS. 6 and 7 to generate image pixel layout 840 for generating voltage contrast images of nodes 842. In some embodiments, varying scan rates may result in each node of a wafer being charged in different quantities (e.g., non-uniform charging). In some embodiments, as shown in pixel layout 840, varying scan rates may result in each pixel 841 of a generated image varying in size.

In some embodiments, following the generation of voltage contrast images, an image acquirer of a controller (e.g., controller 109 of FIGS. 1-2) may perform adjustments to the image pixel size such that the pixel size is uniform in the generated pixel layout 850. As shown in pixel layout 850, each pixel 851 is substantially the same size, resulting in distorted voltage contrast images of nodes 842 (e.g., nodes). The inspection may include comparing the generated voltage contrast images from pixel layout 850 to similarly distorted reference voltage contrast images.

Figure 9:
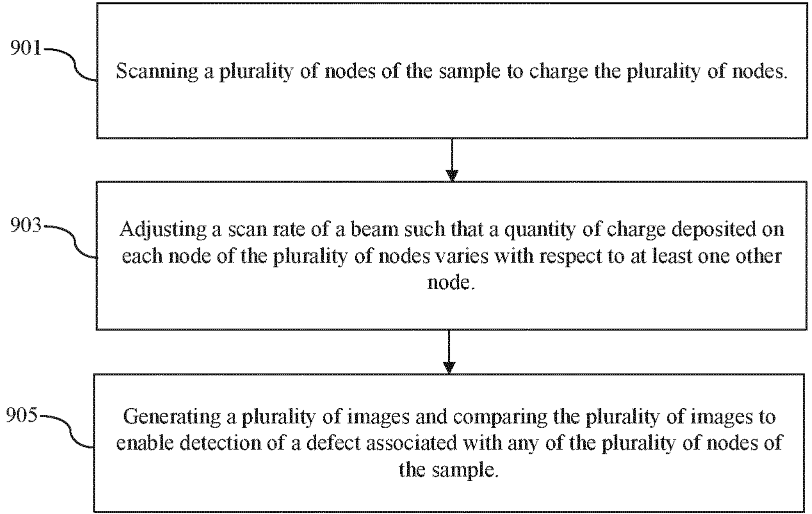
FIG. 9 is a flowchart illustrating an exemplary process of inspecting a sample, consistent with embodiments of the present disclosure.

Reference is now made to FIG. 9, a flowchart illustrating an exemplary process 900 of inspecting a sample, consistent with embodiments of the present disclosure.

At step 901, a controller (e.g., controller 109 of FIGS. 1-2) may include circuitry configured to position the stage (e.g., motorized stage 209 of FIG. 2) at a plurality of positions to enable a beam (e.g., primary beamlets 211, 212, or 213 of FIG. 2, electron beam 610 of FIG. 6, or electron beam 710 of FIG. 7) to scan a plurality of nodes (e.g., nodes 621 or 622 of FIG. 6 or nodes 721 or 722 of FIG. 7) of a sample (e.g., sample 208 of FIG. 2, wafer 608 of FIG. 6, or wafer 708 of FIG. 7) to charge the plurality of nodes.

In some embodiments, an image of a wafer may be formed by scanning a primary beam of an electron tool (e.g., electron tool 104 of FIG. 2) over the wafer and collecting particles (e.g., secondary electron beams 261, 262, or 263 of FIG. 2) generated from the wafer surface at a detector (e.g., detection device 240 of FIG. 2). The process of imaging may include focusing the primary beam to a point, and deflecting (e.g., bending) the beam so that it passes over regions of the wafer in a line-by-line pattern (e.g., a raster scan). At a given time, the beam may be focused to a particular position on the wafer, and output of the detector at this time may be correlated to that particular position on the wafer. An image may be reconstructed based on detector output at each time along the beam scan path.

Scanning may be performed by electrostatic deflectors (e.g., deflection scanning unit 232 of FIG. 2). In some embodiments, a deflector may include two metallic plates with a voltage applied between the plates to create an electric field deflecting the electrons in the direction perpendicular to the primary optical axis (e.g., primary optical axis 204 of FIG. 2). Multiple pairs of metallic plates may be provided. In some embodiments, beam blankers may be used to control deflection of a beam.

In the scanning operation mode of a multi-beam system, the deflector may constantly move the array of primary beamlets across the inspected area of the wafer. For example, the deflector may deflect beamlets so that beam spots (e.g., probe spots 221, 222, or 223 of FIG. 2) move from different positions on the wafer. Secondary electrons may be generated at each position that corresponding probe spots are formed at on the surface of the wafer. The origin positions of the secondary electron beamlets during scanning may change constantly in operation, and the paths of the secondary electron beamlets through the electron-optical system may also change.

For example, an electron beam tool may generate images by continuous raster scanning an electron beam over the wafer including a plurality of nodes (e.g., contacts). The speed of the motorized stage may be controlled so that the speed of the stage holding the wafer may vary during inspection and so that the wafer may be continuously scanned.

At step 903, the circuitry may be further configured to adjust a scan rate of the beam such that a quantity of charge deposited on each node of the plurality of nodes varies with respect to at least one other node. For example, the wafer may include a plurality of nodes that have substantially the same capacitance. The electron beam tool may apply a voltage between the plates of the deflector non-linearly (e.g., parabolically) with respect to time. For example, the electron beam tool may apply voltage to the deflector non-linearly with respect to time such that electrons are deflected to and beam spots move across stripes (e.g., stripes 601 or 602 of FIG. 6 or stripes 701 or 702 of FIG. 7) of the wafer at varying rates (e.g., varying scan rates, varying scan accelerations, varying charge rates, varying charge accelerations, etc.). In some embodiments, varying scan rates may result in varying time intervals between the times at which any particular location on the wafer is successively scanned by each of multiple beams. In some embodiments, charging of each node may be controlled by changing the number of scans on the wafer, changing the current of a beam that is directed to a node, etc. In some embodiments, one or more settings (e.g., number of scans on the wafer, current of a beam directed to a node, etc.) may be changed while other settings remain constant during scanning.

In some embodiments, non-uniform charging of the wafer may be achieved by adjusting the speed of the motorized stage or the time intervals between the times at which any particular location on the wafer is successively scanned by each of multiple beams. The detector (e.g., detection device 240 of FIG. 2) may be configured to produce detection data based on a detection of a plurality of secondary charged particles (e.g., secondary electron beams 261, 262, or 263 of FIG. 2) associated with the plurality of beamlets of a primary electron beam impacting the first surface area.

In some embodiments, varying scan rates may result in each node of the wafer being charged in different quantities (e.g., non-uniform charging). In some embodiments, varying scan rates may result in each pixel of a generated image varying in size. In some embodiments, non-uniform charging of the wafer may be controlled by setting target pixel sizes (e.g., such that a beam contacts the wafer every "n" nm of the wafer) and adjusting the voltage applied to the deflector, adjusting the motorized stage speed, adjusting the scanning time intervals, etc. according to the target pixel sizes. In some embodiments, non-uniform charging of the wafer may be controlled by setting a target scan width of the wafer. In some embodiments, one or more pixels of a wafer or pixels of an image may be associated with a node on the wafer.

In some embodiments, each stripe of the wafer may be scanned such that the generated pixel size of an image increases as the electron beam is emitted along a stripe. In some embodiments, the increasing pixel size may be generated along a stripe by adjusting the scanning rate such that the velocity at which an electron beam traverses a surface of the wafer during a scan of the stripe decreases along the stripe. In some embodiments, the quantity of charge deposited on each node may decrease along the stripe since the electron beam may contact each node in decreasing velocity along the stripe.

At step 905, the circuitry may be further configured to generate a plurality of images and compare the plurality of images to enable detection of a defect associated with any of the plurality of nodes of the sample. As a result of non-uniform charging, the total count of primary electrons may decrease along the stripe such that on a first side of the stripe, more electrons may leave the surface of the wafer than land onto the surface of the wafer, which may result in a positive electrical potential at the surface of the wafer. Due to the decreasing quantity of charge deposited on each node and decreasing quantity of positive surface potential from along the stripe, an electron beam tool may generate a voltage contrast image associated with each node that varies in gradient. Since the detection device may receive fewer secondary electrons when the electrical potential at the surface of the wafer is positive, the voltage contrast image associated with each node may vary in gradient such that the voltage contrast image becomes brighter from along a stripe.

In some embodiments, the increase or decrease in scanning rates may change in equivalent increments along a stripe of the wafer. For example, the pixel size of each pixel of a generated image along a stripe may be 5 nm, 10 nm, 15 nm, etc. In some embodiments, the increase or decrease in non-uniform charging may change in varying increments of scanning rates along a stripe of the wafer. For example, the pixel size of each pixel of a generated image along a stripe may be 5 nm, 7 nm, 10 nm, 16 nm, etc.

In some embodiments, each stripe of the wafer may be scanned in the same non-uniform manner. For example, voltage contrast images generated for a first stripe may vary in a gradient that is equivalent to voltage contrast images generated for a second stripe. In some embodiments, each stripe of the wafer may be scanned non-uniformly in varying pattern. For example, voltage contrast images generated for a first stripe may vary in a gradient that is different from voltage contrast images generated for a second stripe.

In some embodiments, each node of the wafer may have substantially the same capacitance. In some embodiments, inspection of the nodes of the wafer may include comparing voltage contrast images along a stripe of the wafer. For example, voltage contrast images of a stripe of nodes without any defects may show a gradient of voltage contrast levels such that each node of the stripe is a different voltage contrast level. In some embodiments, inspection of the nodes of the wafer may include comparing voltage contrast images along a column of nodes arranged in direction perpendicular to the scanning direction. For example, voltage contrast images of a column of nodes arranged without any defects may show a gradient of voltage contrast levels such that each node of the column is a different voltage contrast level. In some embodiments, a voltage contrast level of a selected node may be indicated by a grey scale value of a point on an image (e.g., SEM image) that is associated with the selected node.

In some embodiments, an electrical short circuit (e.g., electrical short circuit 620 of FIG. 6 or electrical short circuit 720 of FIG. 7) may exist between a first node (e.g., node 621 of FIG. 6 or node 721 of FIG. 7) and a second node (e.g., node 622 of FIG. 6 node 722 of FIG. 7). Even though the first and second nodes are not charged equal amounts due to non-uniform charging, current may flow between the nodes such that the nodes have substantially the same voltage. Therefore, the voltage contrast response of the nodes may be substantially the same and the electrical short circuit may advantageously be detectable during inspection since non-uniform charging of the wafer results in voltage contrast images that vary in gradient for each node along a row of the wafer.

In some embodiments, voltage contrast images of the wafer may be compared to voltage contrast images of the same pattern on a neighboring die to detect defects. In some embodiments, voltage contrast images of the wafer may be compared to voltage contrast images of a "perfect" die (e.g., a die without defects) that was scanned at a different time to detect defects.

A non-transitory computer readable medium may be provided that stores instructions for a processor of a controller (e.g., controller 109 of FIG. 1) for controlling the electron beam tool, consistent with embodiments in the present disclosure. Common forms of non-transitory media include, for example, a floppy disk, a flexible disk, hard disk, solid state drive, magnetic tape, or any other magnetic data storage medium, a Compact Disc Read Only Memory (CD-ROM), any other optical data storage medium, any physical medium with patterns of holes, a Random Access Memory (RAM), a Programmable Read Only Memory (PROM), and Erasable Programmable Read Only Memory (EPROM), a FLASH-EPROM or any other flash memory, Non-Volatile Random Access Memory (NVRAM), a cache, a register, any other memory chip or cartridge, and networked versions of the same.

The embodiments may further be described using the following clauses:

1. A system for inspecting a sample, the system comprising:
   a controller including circuitry configured to cause the system to perform: scanning a plurality of nodes of the sample to charge the plurality of nodes; adjusting a scan rate of a beam such that a quantity of charge deposited on each node of the plurality of nodes varies with respect to at least one other node; generating a plurality of images; and comparing the plurality of images to enable detection of a defect associated with any of the plurality of nodes of the sample.
2. The system of clause 1, further comprising a detector that is communicatively coupled to the controller and configured to produce detection data based on a detection of electrons emitted from the sample in response to the beam scanning the sample.
3. The system of any one of clauses 1-2, further comprising a deflector that is configured to adjust the scan rate by deflecting the beam such that a scan rate of the beam varies during a scan of a line on the sample.
4. The system of clause 3, wherein the circuitry is further configured to vary the scan rate by varying a rate of change of a voltage applied to the deflector.
5. The system of any one of clauses 1-4, wherein the scan rate reflects a velocity at which the beam traverses a surface of the sample during a scan of a line on the sample.
6. The system of any one of clauses 1-5, wherein the circuitry is further configured to adjust the scan rate by adjusting a speed of a stage that is configured to support the sample.
7. The system of any one of clauses 1-6, wherein the plurality of nodes comprise a row of nodes arranged in a first direction.
8. The system of clause 7, wherein the quantity of charge deposited on each node associated with the row of nodes increases in the first direction.
9. The system of any one of clauses 7-8, wherein the plurality of nodes comprise a column of nodes arranged in a second direction that is perpendicular to the first direction.
10. The system of any one of clauses 7-9, wherein the plurality of images indicate voltage contrast levels associated with the plurality of nodes.
11. The system of clause 10, wherein the circuitry is further configured to detect differences between the voltage contrast levels associated with the plurality of nodes.
12. The system of any one of clauses 10-11, wherein the voltage contrast levels associated with each node varies increasingly or decreasingly in the first direction.
13. The system of any one of clauses 10-12, wherein the voltage contrast levels associated with each node varies increasingly or decreasingly in a second direction.
14. The system of any one of clauses 1-13, wherein a capacitance of each node of the plurality of nodes is equivalent.
15. The system of any one of clauses 1-14, wherein comparing the plurality of images to enable detecting whether a defect is identified in the plurality of nodes of the sample further comprises: comparing a first image associated with a first node to a second image associated with a second node; determining that the voltage contrast levels associated with the first node and the second node are substantially the same; and in response to the determination that the voltage contrast levels associated with the first node and the second node are substantially the same, providing information that indicates that a defect associated with the first node and the second node exists.

16. The system of clause 15, wherein the first node is adjacent to the second node in a first direction.

17. The system of clause 15, wherein the first node is adjacent to the second node in a second direction.

18. The system of any one of clauses 15-16, wherein the defect causes an electrical short between two or more nodes.

19. The system of any one of clauses 2-18, wherein the detector is further configured to produce detection data based on a detection of a plurality of secondary charged particles associated with the beam impacting the sample.

20. The system of clause 19, wherein the circuitry is further configured to modify the plurality of images such that each pixel size of the plurality of images is equivalent.

21. The system of any one of clauses 1-7, 9-11, 14, or 19, further comprising pre-charging the plurality of nodes of the sample, wherein adjusting the scan rate of the beam occurs during the pre-charge and generating the plurality of images occurs during the scan.

22. The system of clause 21, wherein the pre-charge precedes the scan.

23. The system of any one of clauses 21-22, wherein after the pre-charge, a quantity of charge that has been deposited on each node of the plurality of nodes increases in a first direction.

24. The system of any one of clauses 21-23, wherein after the pre-charge, a quantity of charge of each node of the plurality of nodes increases in a second direction.

25. The system of any one of clauses 21-24, wherein after the scan, a change in the quantity of charge deposited on each node of the plurality of nodes is substantially zero.

26. The system of any one of clauses 21-25, wherein a beam current of the beam during the scan is constant during inspection.

27. The system of clause 26, wherein the beam current of the beam during the scan is less than a beam current of the beam during the pre-charge.

28. The system of any one of clauses 21-27, wherein the voltage contrast levels associated with each node varies increasingly or decreasingly in a first direction.

29. The system of any one of clauses 21-28, wherein the voltage contrast levels associated with each node varies increasingly or decreasingly in a second direction.

30. The system of any one of clauses 21-29, wherein comparing the plurality of images to enable detecting whether a defect is identified in the plurality of nodes of the sample further comprises: comparing a first image associated with a first node to a second image associated with a second node; determining that the voltage contrast levels associated with the first node and the second node are substantially the same; and in response to the determination that the voltage contrast levels associated with the first node and the second node are substantially the same, providing information that indicates that a defect associated with the first node and the second node exists.

31. The system of clause 30, wherein the first node is adjacent to the second node in a first direction.

32. The system of clause 30, wherein the first node is adjacent to the second node in a second direction.

33. The system of any one of clauses 30-32, wherein the defect causes an electrical short between two or more nodes.

34. The system of any one of clauses 21-33, wherein a scan rate during the pre-charge varies.

35. The system of any one of clauses 21-34, wherein a scan rate during the scan is constant.

36. A method for inspecting a sample, the method comprising: scanning a plurality of nodes of the sample to charge the plurality of nodes; adjusting a scan rate of a beam such that a quantity of charge deposited on each node of the plurality of nodes varies with respect to at least one other node; generating a plurality of images; and comparing the plurality of images to enable detection of a defect associated with any of the plurality of nodes of the sample.

37. The method of clause 36, further comprising producing detection data based on a detection of electrons emitted from the sample in response to the beam scanning the sample.

38. The method of any one of clauses 36-37, further comprising adjusting, by a deflector, the scan rate by deflecting the beam such that a scan rate of the beam varies during a scan of a line on the sample.

39. The method of clause 38, further comprising varying the scan rate by varying a rate of change of a voltage applied to the deflector.

40. The method of any one of clauses 36-39, wherein the scan rate reflects a velocity at which the beam traverses a surface of the sample during a scan of a line on the sample.

41. The method of any one of clauses 36-40, further comprising adjusting the scan rate by adjusting a speed of a stage that is configured to support the sample.

42. The method of any one of clauses 36-41, wherein the plurality of nodes comprise a row of nodes arranged in a first direction.

43. The method of clause 42, wherein the quantity of charge deposited on each node associated with the row of nodes increases in the first direction.

44. The method of any one of clauses 42-43, wherein the plurality of nodes comprise a column of nodes arranged in a second direction that is perpendicular to the first direction.

45. The method of any one of clauses 42-44, wherein the plurality of images indicate voltage contrast levels associated with the plurality of nodes.

46. The method of clause 45, wherein further comprising detecting differences between the voltage contrast levels associated with the plurality of nodes.

47. The method of any one of clauses 45-46, wherein the voltage contrast levels associated with each node varies increasingly or decreasingly in the first direction.

48. The method of any one of clauses 45-47, wherein the voltage contrast levels associated with each node varies increasingly or decreasingly in a second direction.

49. The method of any one of clauses 36-48, wherein a capacitance of each node of the plurality of nodes is equivalent.

50. The method of any one of clauses 36-49, wherein comparing the plurality of images to enable detecting whether a defect is identified in the plurality of nodes of the sample further comprises: comparing a first image associated with a first node to a second image associated with a second node; determining that the voltage contrast levels associated with the first node and the second node are substantially the same; and in response to the determination that the voltage contrast levels associated with the first node and the second node are substantially the same, providing information that indicates that a defect associated with the first node and the second node exists.

51. The method of clause 50, wherein the first node is adjacent to the second node in a first direction.

52. The method of clause 50, wherein the first node is adjacent to the second node in a second direction.

53. The method of any one of clauses 50-51, wherein the defect causes an electrical short between two or more nodes.

54. The method of any one of clauses 36-53, further comprising producing detection data based on a detection of a plurality of secondary charged particles associated with the beam impacting the sample.

55. The method of clause 54, further comprising modifying the plurality of images such that each pixel size of the plurality of images is equivalent.

56. The method of any one of clauses 36-42, 44-46, 49, or 54, further comprising pre-charging the plurality of nodes of the sample, wherein adjusting the scan rate of the beam occurs during the pre-charge and generating the plurality of images occurs during the scan.

57. The method of clause 56, wherein the pre-charge precedes the scan.

58. The method of any one of clauses 56-57, wherein after the pre-charge, a quantity of charge that has been deposited on each node of the plurality of nodes increases in a first direction.

59. The method of any one of clauses 56-58, wherein after the pre-charge, a quantity of charge of each node of the plurality of nodes increases in a second direction.

60. The method of any one of clauses 56-59, wherein after the scan, a change in the quantity of charge deposited on each node of the plurality of nodes is substantially zero.

61. The method of any one of clauses 56-60, wherein a beam current of the beam during the scan is constant during inspection.

62. The method of clause 61, wherein the beam current of the beam during the scan is less than a beam current of the beam during the pre-charge.

63. The method of any one of clauses 56-62, wherein the voltage contrast levels associated with each node varies increasingly or decreasingly in a first direction.

64. The method of any one of clauses 56-63, wherein the voltage contrast levels associated with each node varies increasingly or decreasingly in a second direction.

65. The method of any one of clauses 56-64, wherein comparing the plurality of images to enable detecting whether a defect is identified in the plurality of nodes of the sample further comprises: comparing a first image associated with a first node to a second image associated with a second node; determining that the voltage contrast levels associated with the first node and the second node are substantially the same; and in response to the determination that the voltage contrast levels associated with the first node and the second node are substantially the same, providing information that indicates that a defect associated with the first node and the second node exists.

66. The method of clause 65, wherein the first node is adjacent to the second node in a first direction.

67. The method of clause 65, wherein the first node is adjacent to the second node in a second direction.

68. The method of any one of clauses 65-67, wherein the defect causes an electrical short between two or more nodes.

69. The method of any one of clauses 56-68, wherein a scan rate during the pre-charge varies.

70. The method of any one of clauses 56-69, wherein a scan rate during the scan is constant.

71. A non-transitory computer readable medium that stores a set of instructions that is executable by at least one processor of a computing device to cause the computing device to perform a method for inspection of a sample, the method comprising: scanning a plurality of nodes of the sample to charge the plurality of nodes; adjusting a scan rate of a beam such that a quantity of charge deposited on each node of the plurality of nodes varies with respect to at least one other node; generating a plurality of images; and comparing the plurality of images to enable detection of a defect associated with any of the plurality of nodes of the sample.

72. The non-transitory computer readable medium of clause 71, wherein the set of instructions that is executable by the at least one processor of the computing device to cause the computing device to further perform producing detection data based on a detection of electrons emitted from the sample in response to the beam scanning the sample.

73. The non-transitory computer readable medium of any one of clauses 71-72, wherein the set of instructions that is executable by the at least one processor of the computing device to cause the computing device to further perform adjusting, by a deflector, the scan rate by deflecting the beam such that a scan rate of the beam varies during a scan of a line on the sample.

74. The non-transitory computer readable medium of clause 73, wherein the set of instructions that is executable by the at least one processor of the computing device to cause the computing device to further perform varying the scan rate by varying a rate of change of a voltage applied to the deflector.

75. The non-transitory computer readable medium of any one of clauses 71-74, wherein the scan rate of the beam, wherein the scanning rate reflects a velocity at which the beam traverses a surface of the sample during a scan of a line on the sample.

76. The non-transitory computer readable medium of any one of clauses 71-75, wherein the set of instructions that is executable by the at least one processor of the computing device to cause the computing device to further perform adjusting the scan rate by adjusting a speed of a stage that is configured to support the sample.

77. The non-transitory computer readable medium of any one of clauses 71-76, wherein the plurality of nodes comprise a row of nodes arranged in a first direction.

78. The non-transitory computer readable medium of clause 77, wherein the quantity of charge deposited on each node associated with the row of nodes increases in the first direction.

79. The non-transitory computer readable medium of any one of clauses 77-78, wherein the plurality of nodes comprise a column of nodes arranged in a second direction that is perpendicular to the first direction.

80. The non-transitory computer readable medium of any one of clauses 77-79, wherein the plurality of images indicate voltage contrast levels associated with the plurality of nodes.

81. The non-transitory computer readable medium of clause 80, wherein the set of instructions that is executable by the at least one processor of the computing device to cause the computing device to further perform detecting differences between the voltage contrast levels associated with the plurality of nodes.
82. The non-transitory computer readable medium of any one of clauses 80-81, wherein the voltage contrast levels associated with each node varies increasingly or decreasingly in the first direction.
83. The non-transitory computer readable medium of any one of clauses 80-82, wherein the voltage contrast levels associated with each node varies increasingly or decreasingly in a second direction.
84. The non-transitory computer readable medium of any one of clauses 71-83, wherein a capacitance of each node of the plurality of nodes is equivalent.
85. The non-transitory computer readable medium of any one of clauses 71-84, wherein comparing the plurality of images to enable detecting whether a defect is identified in the plurality of nodes of the sample further comprises: comparing a first image associated with a first node to a second image associated with a second node; determining that the voltage contrast levels associated with the first node and the second node are substantially the same; and in response to the determination that the voltage contrast levels associated with the first node and the second node are substantially the same, providing information that indicates that a defect associated with the first node and the second node exists.
86. The non-transitory computer readable medium of clause 85, wherein the first node is adjacent to the second node in a first direction.
87. The non-transitory computer readable medium of clause 85, wherein the first node is adjacent to the second node in a second direction.
88. The non-transitory computer readable medium of any one of clauses 85-86, wherein the defect causes an electrical short between two or more nodes.
89. The non-transitory computer readable medium of any one of clauses 72-88, wherein the set of instructions that is executable by the at least one processor of the computing device to cause the computing device to further perform producing detection data based on a detection of a plurality of secondary charged particles associated with the beam impacting the sample.
90. The non-transitory computer readable medium of clause 89, wherein the set of instructions that is executable by the at least one processor of the computing device to cause the computing device to further perform modifying the plurality of images such that each pixel size of the plurality of images is equivalent.
91. The non-transitory computer readable medium of any one of clauses 71-77, 79-81, 84, or 89, wherein the set of instructions that is executable by the at least one processor of the computing device to cause the computing device to further perform pre-charging the plurality of nodes of the sample, wherein adjusting the scan rate of the beam occurs during the pre-charge and generating the plurality of images occurs during the scan.
92. The non-transitory computer readable medium of clause 91, wherein the pre-charge precedes the scan.
93. The non-transitory computer readable medium of any one of clauses 91-92, wherein after the pre-charge, a quantity of charge that has been deposited on each node of the plurality of nodes increases in a first direction.
94. The non-transitory computer readable medium of any one of clauses 91-93, wherein after the pre-charge, a quantity of charge of each node of the plurality of nodes increases in a second direction.
95. The non-transitory computer readable medium of any one of clauses 91-94, wherein after the scan, a change in the quantity of charge deposited on each node of the plurality of nodes is substantially zero.
96. The non-transitory computer readable medium of any one of clauses 91-95, wherein a beam current of the beam during the scan is constant during inspection.
97. The non-transitory computer readable medium of clause 96, wherein the beam current of the beam during the scan is less than a beam current of the beam during the pre-charge.
98. The non-transitory computer readable medium of any one of clauses 91-97, wherein the voltage contrast levels associated with each node varies increasingly or decreasingly in a first direction.
99. The non-transitory computer readable medium of any one of clauses 91-98, wherein the voltage contrast levels associated with each node varies increasingly or decreasingly in a second direction.
100. The non-transitory computer readable medium of any one of clauses 91-99, wherein comparing the plurality of images to enable detecting whether a defect is identified in the plurality of nodes of the sample further comprises: comparing a first image associated with a first node to a second image associated with a second node; determining that the voltage contrast levels associated with the first node and the second node are substantially the same; and in response to the determination that the voltage contrast levels associated with the first node and the second node are substantially the same, providing information that indicates that a defect associated with the first node and the second node exists.
101. The non-transitory computer readable medium of clause 100, wherein the first node is adjacent to the second node in a first direction.
102. The non-transitory computer readable medium of clause 100, wherein the first node is adjacent to the second node in a second direction.
103. The non-transitory computer readable medium of any one of clauses 100-102, wherein the defect causes an electrical short between two or more nodes.
104. The non-transitory computer readable medium of any one of clauses 91-103, wherein a scan rate during the pre-charge varies.
105. The non-transitory computer readable medium of any one of clauses 91-104, wherein a scan rate during the scan is constant.
106. The system of any one of clauses 1-35, wherein scanning comprises positioning a stage at a plurality of positions.
107. The system of any one of clauses 10-35 or 106, wherein a voltage contrast level of a selected node is indicated by a grey scale value of a point on an image that is associated with the selected node.
108. The system of any one of clauses 18-20, 33-35, or 106-107, wherein the electrical short is a resistive short.
109. The method of any one of clauses 36-70, wherein scanning comprises positioning a stage at a plurality of positions.

110. The method of any one of clauses 45-70 or 109, wherein a voltage contrast level of a selected node is indicated by a grey scale value of a point on an image that is associated with the selected node.

111. The method of any one of clauses 53-55, 68-70, or 109-110, wherein the electrical short is a resistive short.

112. The non-transitory computer readable medium of any one of clauses 71-105, wherein scanning comprises positioning a stage at a plurality of positions.

113. The non-transitory computer readable medium of any one of clauses 80-105 or 112, wherein a voltage contrast level of a selected node is indicated by a grey scale value of a point on an image that is associated with the selected node.

114. The non-transitory computer readable medium of any one of clauses 88-90, 103-105, or 112-113, wherein the electrical short is a resistive short.

It will be appreciated that the embodiments of the present disclosure are not limited to the exact construction that has been described above and illustrated in the accompanying drawings, and that various modifications and changes may be made without departing from the scope thereof.

The invention claimed is:

1. A system for inspecting a sample, the system comprising:

a controller including circuitry configured to cause the system to perform:

scanning a plurality of nodes of the sample to charge the plurality of nodes;

adjusting a scan rate of a charged particle beam such that a quantity of charge deposited on each node of the plurality of nodes varies with respect to at least one other node;

generating a plurality of images; and comparing the plurality of images to enable detection of a defect associated with any of the plurality of nodes of the sample.

2. The system of claim 1, further comprising a detector that is communicatively coupled to the controller and configured to produce detection data based on a detection of electrons emitted from the sample in response to the beam scanning the sample.

3. The system of claim 1, further comprising a deflector that is configured to adjust the scan rate by deflecting the beam such that a scan rate of the beam varies during a scan of a line on the sample.

4. The system of claim 3, wherein the circuitry is further configured to vary the scan rate by varying a rate of change of a voltage applied to the deflector.

5. The system of claim 1, wherein the scan rate reflects a velocity at which the beam traverses a surface of the sample during a scan of a line on the sample.

6. The system of claim 1, wherein the circuitry is further configured to adjust the scan rate by adjusting a speed of a stage that is configured to support the sample.

7. The system of claim 1, wherein the plurality of nodes comprise a row of nodes arranged in a first direction.

8. The system of claim 7, wherein the quantity of charge deposited on each node associated with the row of nodes increases in the first direction.

9. The system of claim 7, wherein the plurality of nodes comprise a column of nodes arranged in a second direction that is perpendicular to the first direction.

10. The system of claim 7, wherein the plurality of images indicate voltage contrast levels associated with the plurality of nodes.

11. The system of claim 10, wherein the circuitry is further configured to detect differences between the voltage contrast levels associated with the plurality of nodes.

12. The system of claim 10, wherein the voltage contrast levels associated with each node varies increasingly or decreasingly in the first direction.

13. The system of claim 10, wherein the voltage contrast levels associated with each node varies increasingly or decreasingly in a second direction.

14. The system of claim 1, wherein a capacitance of each node of the plurality of nodes is equivalent.

15. The system of claim 1, wherein comparing the plurality of images to enable detecting whether a defect is identified in the plurality of nodes of the sample further comprises:

comparing a first image associated with a first node to a second image associated with a second node;

determining that voltage contrast levels associated with the first node and the second node are substantially the same; and in response to the determination that the voltage contrast levels associated with the first node and the second node are substantially the same, providing information that indicates that a defect associated with the first node and the second node exists.

16. A non-transitory computer readable medium that stores a set of instructions that is executable by at least one processor of a computing device to cause the computing device to perform a method for inspection of a sample, the method comprising: scanning a plurality of nodes of the sample to charge the plurality of nodes; adjusting a scan rate of a charged particle beam such that a quantity of charge deposited on each node of the plurality of nodes varies with respect to at least one other node; generating a plurality of images; and comparing the plurality of images to enable detection of a defect associated with any of the plurality of nodes of the sample.

17. The non-transitory computer readable medium of claim 16, wherein the set of instructions that is executable by the at least one processor of the computing device to cause the computing device to further perform producing detection data based on a detection of electrons emitted from the sample in response to the beam scanning the sample.

18. The non-transitory computer readable medium of claim 16, wherein the set of instructions that is executable by the at least one processor of the computing device to cause the computing device to further perform adjusting, by a deflector, the scan rate by deflecting the beam such that a scan rate of the beam varies during a scan of a line on the sample.

19. The non-transitory computer readable medium of claim 18, wherein the set of instructions that is executable by the at least one processor of the computing device to cause the computing device to further perform varying the scan rate by varying a rate of change of a voltage applied to the deflector.

20. The non-transitory computer readable medium of claim 16, wherein the scan rate of the beam, wherein the scanning rate reflects a velocity at which the beam traverses a surface of the sample during a scan of a line on the sample.

* * * * *